US007647033B2

(12) United States Patent
Uozumi et al.

(10) Patent No.: US 7,647,033 B2
(45) Date of Patent: Jan. 12, 2010

(54) SEMICONDUCTOR INTEGRATED CIRCUIT DEVICE FOR COMMUNICATION

(75) Inventors: Toshiya Uozumi, Tokyo (JP); Jiro Shimbo, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 518 days.

(21) Appl. No.: 11/626,585

(22) Filed: Jan. 24, 2007

(65) Prior Publication Data
US 2007/0236297 A1  Oct. 11, 2007

(30) Foreign Application Priority Data
Mar. 23, 2006  (JP) ............... 2006-081453

(51) Int. Cl.
*H04B 1/06* (2006.01)
*H04Q 7/20* (2006.01)

(52) U.S. Cl. .................. 455/260; 455/76; 327/147; 327/156; 375/376

(58) Field of Classification Search .............. 455/76, 455/260; 327/147, 156; 375/376
See application file for complete search history.

(56) References Cited

U.S. PATENT DOCUMENTS 7,425,852 B2 *  9/2008  Garzarolli et al. ........... 327/156

FOREIGN PATENT DOCUMENTS

JP   2002280919   *  9/2002

OTHER PUBLICATIONS

"A Multiple Modulator Fractional Divider" by Brian Miller, et al. IEEE Transactions of Instrumentation and Measurement, vol. 40, No. 3. Jun. 1991., pp. 578-583.
"A Fractional-N Frequency Synthesizer for Wireless Communications", by A.E. Hussein, et al., 2002 IEEE. pp. 513-516.

* cited by examiner

*Primary Examiner*—Lee Nguyen
(74) *Attorney, Agent, or Firm*—Mattingly & Malur, P.C.

(57) ABSTRACT

A level converter level-converts an oscillation output signal of a reference frequency oscillator and supplies the level-converted signal to a phase comparator of a PLL/fractional synthesizer for controlling an oscillation frequency of an RF transmission voltage-controlled oscillator. The level converter includes a self-bias type voltage amplifier which amplifies a reference frequency signal of the reference frequency oscillator. The self-bias type voltage amplifier includes a coupling capacitor, an amplifying transistor, a load and a bias element and suppresses a variation in the level of each harmonic component even though an external power supply voltage varies.

14 Claims, 16 Drawing Sheets $N = I + (F/G) = 137 + (403/1625) = 137.248$
$F_{REF} = F_{RFVCO}/N = 3568.448 MHz/137.248 = 26 MHz$

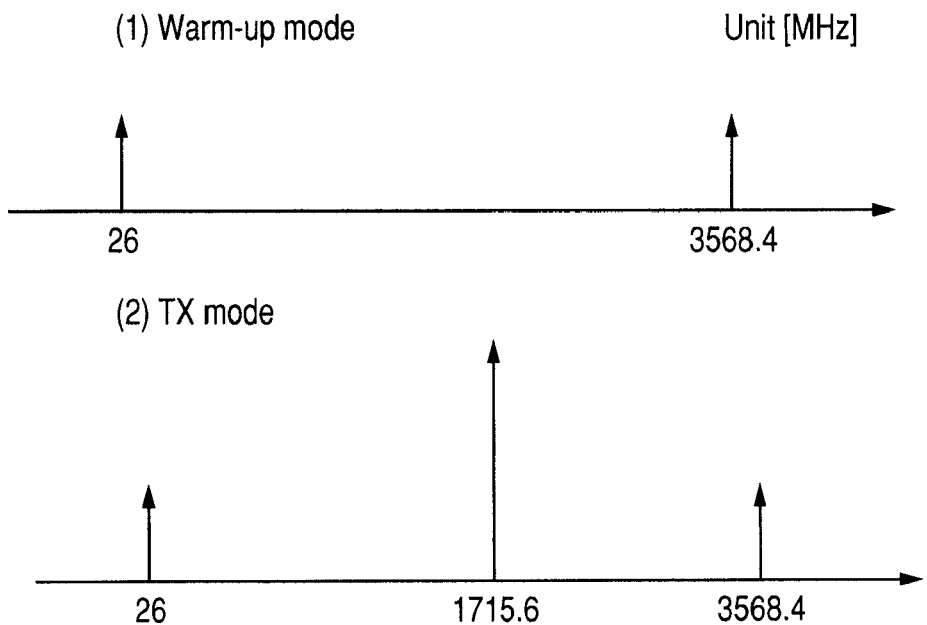
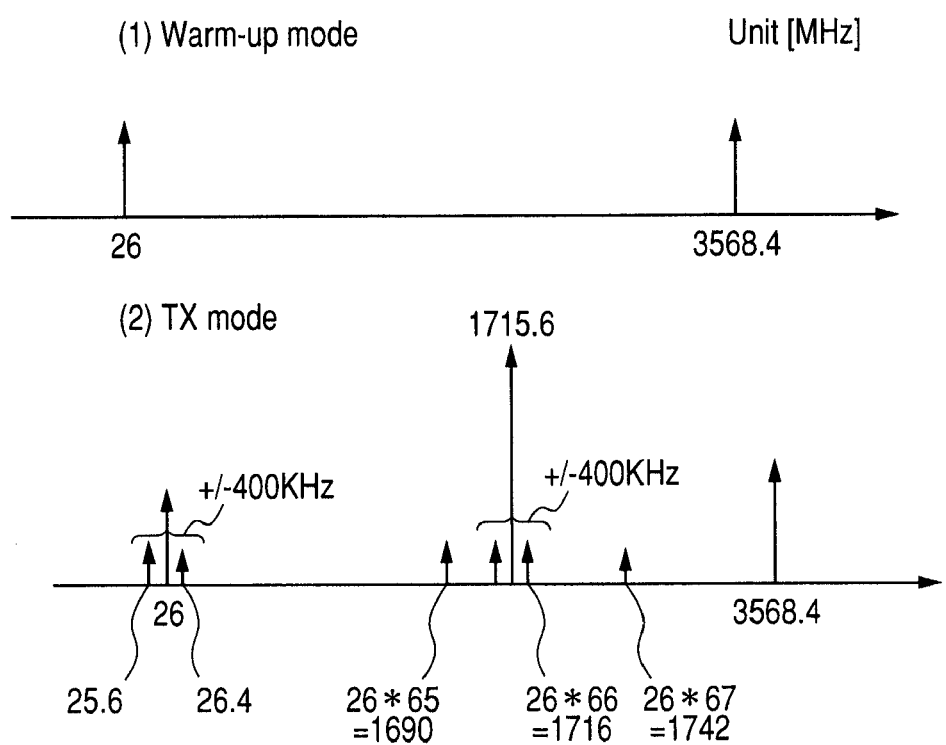

SEMICONDUCTOR INTEGRATED CIRCUIT DEVICE FOR COMMUNICATION

CROSS-REFERENCE TO RELATED APPLICATION

The present application claims priority from Japanese patent application No. 2006-81453 filed on Mar. 23, 2006, the content of which is hereby incorporated by reference into this application.

BACKGROUND OF THE INVENTION

The present invention relates to a semiconductor integrated circuit device for communication, which is equipped with a PLL (Phase Locked Loop) circuit, and particularly to a technique beneficial to a fractional PLL circuit or fractional synthesizer including a fraction (decimal fraction) as well as an integer as a division ratio.

In a general PLL circuit whose division ratio is an integer alone, the frequency resolution of a locked loop becomes a reference frequency fREF. Therefore, the accurate frequency resolution needs a small reference frequency fREF. Thus, it becomes a small loop frequency band. It is not desirable to use a narrow loop frequency band because it becomes a long switching time. The suppression of phase noise of a voltage-controlled oscillator (VCO) in the PLL circuit is insufficient and the PLL circuit is hence susceptible to noise produced from outside the PLL circuit.

According to a non-patent document 1 (Brian Miller and Robert J. Conley "A Multiple Modulator Fractional Divider", IEEE TRANSACTIONS ON INSTRUMENTATION AND MEASUREMENT, VOL. 40. NO. 3. JUNE 1991, PP. 578-583), a fractional synthesizer is developed to have frequency resolution more accurate than a reference frequency fREF. In a fractional N divider, its division ratio is periodically changed from N to N+1. Eventually, a means or average division ratio is increased by a duty ratio of (N+1) division than N. An overflow from an accumulator is used to modulate an instantaneous division ratio.

Thus, in the fractional PLL circuit, the division ratio N of a divider in a negative feedback loop thereof is a rational number including a fraction (decimal fraction) as well as an integer. It has been described in a non-patent document 2 (Tom A. D. Riley et al "Delta-Sigma Modulation in Fractional-N Frequency Synthesis", IEEE JOURNAL OF SOLID-STATE CIRCUITS, VOL. 28. NO. 5. MAY 1993. PP. 553-559) that a wide loop band relative to given channel spacing enables high-speed/settling time by the fractional N division and a phase noise request required of a voltage-controlled oscillator is also reduced or decreased. The non-patent document 1 also describes a dual modulus divider in which a division ratio related to an accumulator of a primary or first-order $\Delta\Sigma$ modulator (also called "$\Sigma\Delta$ modulator") is n/n+1. The condition for the overflow of the accumulator is used in shift for division to n+1. Further, it has been reported in the non-patent document 2 that a spurious output frequency at a fractional frequency synthesis is also reduced by a high-order noise shaving technique based on high-order $\Delta\Sigma$ modulation for the fractional N division.

Further, a fractional N frequency synthesizer using MASH (Multistage noise Shaping Technique) in which a plurality of primary or first-order $\Sigma\Delta$ modulators are configured in multistage form, has been reported in a non-patent document 3 (A. E. Hussein and M. I. Elmasry "A FRACTIONAL-N FREQUENCY SYNTHESIZER FOR WIRELESS COMMUNICATIONS", 2002 IEEE International Symposium Circuits and Systems, PP. IV-513-IV-516).

SUMMARY OF THE INVENTION

Prior to the present invention, the present inventors et al. were involved in the development of an RF IC adapted to communications for a GSM system.

The GSM system (Global System for Mobile Communication) is of a communication system used as one TDMA system, which performs GMSK (Gaussian minimum Shift Keying) modulation using only phase modulation. Incidentally, TDMA is an abbreviation of Time-Division Multiple Access. The TDMA system is capable of setting individual time slots of a plurality of the time slots of each cellular phone terminal to any of an idle state, a receiving operation from a base station and a transmitting operation for the base station. There is also known a method or system of improving a communication data transfer rate as compared with the GSM system. As such an improvement system, attention has recently been given to an EDGE (Enhanced Data for GSM Evolution; Enhanced Data for GPRS) system which makes use of amplitude modulation along with phase modulation. Incidentally, GPRS is an abbreviation of General Packet Radio Service.

In a fractional PLL circuit of this RF IC, an oscillation frequency fTXVCO of an RF transmission voltage-controlled oscillator TXVCO is generated on the basis of a reference oscillation frequency fREF of a reference frequency oscillator DCXO which generates a stable and accurate reference signal by a crystal oscillator and an automatic frequency control (AFC) signal outputted from a baseband LSI. An RF IC adapted to the recent GSM communication system is configured so as to adapt to four frequency bands of GSM850 MHz, GSM900 MHz, DCS1800 MHz and PCS1900 MHz. Thus, the oscillation frequency fTXVCO of the RF transmission voltage-controlled oscillator TXVCO must be adapted to the four multi-frequency bands. The reference oscillation frequency fREF of the reference frequency oscillator DCXO of the RF IC is a relatively low frequency on the order of a few tens of MHz, whereas the oscillation frequency fTXVCO of the RF transmission voltage-controlled oscillator TXVCO corresponding to a plurality of multi-frequency bands becomes a relatively high frequency on the order of a few GHz. Thus, the oscillation frequency fTXVCO from the RF transmission voltage-controlled oscillator TXVCO becomes a frequency far higher than the reference oscillation frequency fREF of the reference frequency oscillator DCXO. Thus, the fractional PLL circuit of the RF IC effects frequency multiplication based on a frequency multiplication ratio corresponding to the inverse of a fractional N division ratio on the oscillation frequency fREF on the order of a few tens of MHz, of the reference frequency oscillator DCXO thereby to generate a reference oscillation frequency fTXVCO of the RF transmission voltage-controlled oscillator TXVCO, which is on the order of a few GHz.

On the other hand, since the RF IC is supplied with an external power supply voltage having a fluctuation width or range from 2.7 volts to 3.0 volts, the reference oscillation frequency fREF of the reference frequency oscillator DCXO must be prevented from varying due to variations in the external power supply voltage. Therefore, the varying external power supply voltage is supplied to an on-chip voltage regulator, from which an internal stabilized power supply voltage maintained at a stable value of, for example, approximately 2.2 volts is generated. The internal stabilized power supply voltage of approximately 2.2 volts is supplied to the reference frequency oscillator DCXO. If the internal stabilized power supply voltage maintained at the stable value is supplied to the reference frequency oscillator DCXO, then the reference oscillation frequency fREF of the reference frequency oscillator DCXO doe not vary depending on the variations in the external power supply voltage and reaches a stable reference oscillation frequency fREF on the order of a few tens of MHz. Thus, even though the fractional PLL circuit and the RF transmission voltage-controlled oscillator TXVCO of the RF IC are not supplied with the internal stabilized power supply voltage outputted from the on-chip voltage regulator, the oscillation frequency fTXVCO of the RF transmission voltage-controlled oscillator TXVCO can be stably maintained by the fractional PLL circuit in the frequency multiplication ratio corresponding to the inverse of the fractional N division ratio. The fractional PLL circuit includes an RF voltage-controlled oscillator RFVCO for generating RF carrier signals used in frequency conversion from an RF receive signal to each of baseband receive signals at a reception system signal processing subunit of the RF IC and frequency up-conversion from each of baseband transmit signals to an intermediate frequency transmit signal or RF transmit signal at a transmission system signal processing subunit of the RF IC. With the setting of the oscillation frequency of the RF voltage-controlled oscillator RFVCO of the fractional PLL circuit by fractional division, the oscillation frequency of the RF transmission voltage-controlled oscillator TXVCO is finally set.

Meanwhile, since the reference frequency oscillator DCXO is supplied with the internal stabilized power supply voltage of 2.2 volts lower than the external power supply voltage ranging from 2.7 volts to 3.0 volts, the voltage amplitude of the oscillation output of the reference frequency oscillator DCXO also becomes a low voltage of 2.2 volts. On the other hand, the fractional PLL circuit of the RF IC is operated at a high-voltage external power supply voltage having a fluctuation range of 2.7 volts to 3.0 volts. It is thus necessary to boost or step the oscillation voltage signal of the low voltage of 2.2 volts of the reference frequency oscillator DCXO to a high voltage ranging from 2.7 volts to 3.0 volts by a level converter and supply the same to its corresponding phase comparator of the fractional PLL circuit of the RF IC. However, the present inventors et al. have encountered the occurrence of the following spurious signals (unwanted interference signals) in the middle of development of the RF IC corresponding to the GSM system by the present inventors et al., preceding the present invention.

That is, the level converter level-converts the oscillation voltage signal having the low voltage of 2.2 volts, of the reference frequency oscillator DCXO to the high voltage ranging from 2.7 volts to 3.0 volts and supplies the level-converted reference frequency information of the reference frequency oscillator DCXO to one input terminal of the phase comparator of the fractional PLL circuit. Further, a feedback signal outputted from a fractional divider supplied with an oscillation output signal of an RF voltage-controlled oscillator RFVCO is supplied to the other input terminal of the phase comparator of the fractional PLL circuit. Thus, the frequency of the output signal of the RF voltage-controlled oscillator RFVCO is set by the reference oscillation frequency fREF of the reference frequency oscillator DCXO and a division ratio of the fractional divider. When, however, the voltage amplitude of the oscillation output of the reference frequency oscillator DCXO is level-converted, the level converter generates not only fundamental frequency components of 26 MHz of the reference oscillation frequency of the reference frequency oscillator DCXO but also harmonic components of 26 MHz simultaneously. Due to the harmonic components, spurious signals (unwanted interference signals) leak into neighboring frequency components of the oscillation output signal of the RF transmission voltage-controlled oscillator TXVCO. It has been made apparent that the leakage spurious signal components are finally transmitted as adjacent interference signals through an antenna of a cellular phone terminal after having been power-amplified by an RF power amplifier connected to the output of the transmission system signal processing subunit of the RF IC.

The leakage of the spurious signals are greatly attributable to the fact that a fractional PLL circuit having those from a divider using an integer alone to a fractional divider having a division ratio of a rational number including not only an integer but also a fraction as a division ratio is adopted for a frequency synthesizer, whereby it is brought to a wide loop band which enables a fast settling time. The leakage of the spurious signals collaterally results even from a device process technology with an ultra packaging density for the RF IC.

Thus, the present invention has been made based on the above result of investigations by the present inventors et al. It is therefore an object of the present invention to, when an oscillation output signal of a reference frequency oscillator is supplied to a phase comparator of a PLL circuit thereby to control an oscillation frequency of an RF transmission voltage-controlled oscillator by a reference frequency of the reference frequency oscillator and a division ratio of a divider of the PLL circuit, reduce the influence of leakage of an oscillation output signal of the RF transmission voltage-controlled oscillator into its neighborhood due to harmonic components of the oscillation output signal of the reference frequency oscillator, which are generated upon level-converting the oscillation output signal of the reference frequency oscillator by a level converter. Incidentally, the reference frequency oscillator is supplied with an internal stabilized power supply voltage outputted from an on-chip voltage regulator supplied with an external power supply voltage. Hence, an amplitude level of the oscillation output signal of the reference frequency oscillator is relatively low. On the other hand, the circuits such as the phase comparator and the like in the PLL circuit are directly supplied with the external power supply voltage, and there is a need to set an input amplitude level supplied to the input of the phase comparator relatively high. The level converter amplitude/level-converts the relatively low amplitude level of the oscillation output signal of the reference frequency oscillator to the relatively high input amplitude level of the phase comparator.

The above, other objects and novel features of the present invention will become apparent from the description of the present specification and the accompanying drawings.

Summaries of representative ones of the inventions disclosed in the present application will briefly be explained as follows:

A semiconductor integrated circuit device for communication, according to one embodiment of the present invention comprises a PLL circuit which constitutes a frequency synthesizer (Frct_Synth) including a reference frequency oscillator (DCXO) which generates a reference frequency signal having a reference oscillation frequency (fREF), a phase comparator (PDC) having one input terminal supplied with the reference frequency signal formed from the reference frequency oscillator (DCXO), an RF voltage-controlled oscillator (RFVCO) which responds to an output of the phase comparator (PDC), and a divider (DIV) connected between an output terminal of the RF voltage-controlled oscillator (RFVCO) and the other input terminal of the phase comparator (PDC); an RF transmission voltage-controlled oscillator (TXVCO) which generates an RF transmit frequency signal used for an RF transmit signal for RF communication; and a level converter (Lev_Conv) which converts an amplitude level of an oscillation output signal of the reference frequency signal of the reference frequency oscillator (DCXO) to an input amplitude level of the phase comparator (PDC) in the PLL circuit (refer to FIG. 4).

An RF transmit frequency (fTXVCO) of the RF transmit frequency signal generated from the RF transmission voltage-controlled oscillator (TXVCO) is set in response to an oscillation frequency (fRFVCO) of an RF oscillation output signal generated from the RF voltage-controlled oscillator (RFVCO) in the PLL circuit.

The level converter (Lev_Conv) includes a voltage amplifier which amplifies the reference frequency signal of the reference frequency oscillator (DCXO).

The voltage amplifier is configured in a circuit form (Self_Bias_Volt_Amp) of a self-bias type voltage amplifier including a coupling capacitor (C1) having one end supplied with the reference frequency signal of the reference frequency oscillator (DCXO), an amplifying transistor (Qn5) having an input electrode connected to the other end of the coupling capacitor (C1) and having an output electrode supplied with an operating voltage (Vdd_ext) via a load (Qp5), and a bias element (R1) connected between the output electrode and input electrode of the amplifying transistor (Qn5) (see FIG. 10).

According to the means of the one embodiment of the present invention, the voltage amplifier supplied with the reference frequency signal of the reference frequency oscillator (DCXO) through the coupling capacitor (C1) is configured in the circuit form of the self-bias type voltage amplifier (Self_Bias_Volt_Amp). Thus, even though a variation in the level of the operating voltage (Vdd_ext) takes place, a bias voltage for self-biasing based on the bias element (R1) connected between the output electrode of the amplifying transistor (Qn5) and the input electrode thereof changes following the variation in the level of the operating voltage (Vdd_ext). Thus, even though the variation in the level of the operating voltage (Vdd_ext) occurs, the duty ratio between high and low level periods of the level-converted output signal voltage (VOUT) obtained from the output of the self-bias type voltage amplifier (Self_Bias_Volt_Amp) becomes approximately constant. As a result, even if the variation in the level of the operating voltage (Vdd_ext) takes place, it is possible to reduce level variations in harmonic components of the oscillation output signal of the reference frequency oscillator (DCXO), which is contained in the level-converted output signal voltage (VOUT) from the output of the self-bias type voltage amplifier (Self_Bias_Volt_Amp) that constitutes the level converter (Lev_Con).

In a semiconductor integrated circuit device for communication according to a specific embodiment of the present invention, the amplifying transistor (Qn5) and the load (Qp5) are reverse conduction-type transistors.

In a semiconductor integrated circuit device for communication according to a more specific embodiment of the present invention, the PLL circuit which constitutes the frequency synthesizer (Frct_Synth) is a fractional PLL circuit in which a division ratio of the divider (DIV) is periodically changed to allow an average division ratio to contain an integer and a fraction (refer to FIGS. 1, 2 and 3).

According to the means of the more specific embodiment of the present invention, more accurate frequency resolution is obtained and high-speed/settling is enabled.

In a semiconductor integrated circuit device for communication according to a more specific embodiment of the present invention, the fractional PLL circuit includes a ΣΔ modulator (ΣΔMod) for calculating the fraction of the average division ratio (refer to FIGS. 1, 2 and 3).

In a semiconductor integrated circuit device for communication according to a further specific embodiment of the present invention, the ΣΔ modulator (ΣΔMod) is of a MASH type in which a plurality of first-order ΣΔ modulators are configured in multistage form (refer to FIG. 16).

In a semiconductor integrated circuit device for communication according to a still further specific embodiment of the present invention, the ΣΔ modulator (ΣΔMod) of the MASH type is supplied with pseudo random noise outputted from a dither circuit (dither) via a digital differentiator (diff31) (see FIG. 16).

According to the means of the still further specific embodiment of the present invention, the level of each spurious signal in a frequency band adjacent to 400 KHz of a transmission modulation spectrum defined by a GMSK (Gaussian minimum Shift Keying) standard can be reduced.

In a semiconductor integrated circuit device for communication according to a still further specific embodiment of the present invention, the PLL circuit that constitutes the frequency synthesizer (Frct_Synth) includes an intermediate frequency divider (IF DIV) which divides the RF oscillation output signal having the oscillation frequency (fRFVCO) generated from the RF voltage-controlled oscillator (RFVCO) to produce intermediate frequency signals. The semiconductor integrated circuit device include transmitting mixers (TX-MIX_I and TX-MIX_Q) which form an intermediate frequency transmit signal from the intermediate frequency signals generated from the intermediate frequency divider (IF DIV) and transmit baseband signals (TxABI and TxABQ), a transmission system offset PLL circuit (TX_Offset_PLL), and an RF divider (RF DIV) which divides the RF oscillation output signal having the oscillation frequency (fRFVCO) generated from the RF voltage-controlled oscillator (RFVCO) to generate a division RF frequency signal. The transmission system offset PLL circuit (TX_Offset_PLL) includes a phase comparator (PC) having one input terminal supplied with the intermediate frequency transmit signal generated from the transmitting mixers (TX-MIX_I and TX-MIX_Q), the RF transmission voltage-controlled oscillator (TXVCO) which responds to an output of the phase comparator (PC), and a phase control feedback frequency downmixer (DWN_MIX_PM) having one input terminal supplied with the RF transmit frequency signal having the RF transmit frequency (fTXVCO) generated from the RF transmission voltage-controlled oscillator (TXVCO) and the other input terminal supplied with the division RF frequency signal generated from the RF divider (RF DIV). An output signal of the phase control feedback frequency downmixer (DWN_MIX_PM) is supplied to the other input terminal of the phase comparator (PC) (see FIG. 4). In such a manner that the levels of leakage spurious signals caused by mixing at the level converter, of harmonic signal components of the reference frequency signal generated upon level conversion of the level converter (Lev_Conv) and high frequency signal components which have leaked into the level converter (Lev_ Conv) and are related to the RF transmit frequency signal having the RF transmit frequency (fTXVCO) generated from the RF transmission voltage-controlled oscillator (TXVCO) satisfy the GMSK standard at an adjoining frequency (fTXVCO±400 KHz) of the RF transmit frequency (fTXVCO) generated from the RF transmission voltage-controlled oscillator (TXVCO), the levels of the harmonic signal components generated upon the level conversion of the level converter (Lev_Conv) are suppressed by the self-bias type voltage amplifier (Self_Bias_Volt_Amp) of the level converter (Lev_Conv) (see FIG. 10).

A semiconductor integrated circuit device for communication according to a still further specific embodiment of the present invention includes an RF receive signal/analog signal processing circuit (RX SPU). The RF receive/analog signal processing circuit (RX SPU) includes low noise amplifiers (LNA1 through LNA4) each of which amplifies an RF receive signal, and receiving mixers (RX-MIX_I and RX-MIX_Q) which generate receive baseband signals (RxABI and RxABQ) by being supplied with RF amplified reception output signals generated by the low noise amplifiers (LNA1 through LNA4). The PLL circuit that constitutes the frequency synthesizer (Frct_Synth) includes a first divider (DIV1) which divides the RF oscillation output signal having the oscillation frequency (fRFVCO) generated from the RF voltage-controlled oscillator (RFVCO) to thereby form RF carrier signals supplied to the receiving mixers (RX-MIX_I and RX-MIX_Q), and a second divider (DIV4) which divides an output signal of the first divider (DIV1).

When the semiconductor integrated circuit device receives the RF receive signal in a frequency band of GSM850 MHz or a frequency band of GSM900 MHz, the division output signal generated from the first divider (DIV1) is transmitted to the receiving mixers (RX-MIX_I and RX-MIX_Q) as the RF carrier signals, whereby frequency-converted receive baseband signals (RxABI and RxABQ) are generated from the receiving mixers based on the RF receive signal in the frequency band of GSM850 MHz or the frequency band of GSM900 MHz.

When the semiconductor integrated circuit device receives the RF receive signal in a frequency band of DCS1800 MHz or a frequency band of PCS1900 MHz, the RF oscillation output signal having the oscillation frequency (fRFVCO) generated from the RF voltage-controlled oscillator (RFVCO) is transmitted to the receiving mixers (RX-MIX_I and RX-MIX_Q) as the RF carrier signals, whereby frequency-converted receive baseband signals (RxABI and RxABQ) are generated from the RF receive signal in the frequency band of DCS1800 MHz or the frequency band of PCS1900 MHz.

When the semiconductor integrated circuit device forms the RF transmit frequency signal in the frequency band of GSM850 MHz or the frequency band of GSM900 MHz, the intermediate frequency transmit signal is formed by the transmitting mixers (TX-MIX_I and TX-MIX_Q) based on the intermediate frequency signals and transmit baseband signals (TxABI and TxABQ), and each of the first divider (DIV1) and the second divider (DIV4) is operated as the RF divider (RF DIV), whereby a division output signal of the second divider (DIV4) is transmitted to the other input terminal of the phase control feedback frequency downmixer (DWN_MIX_PM) of the transmission system offset PLL circuit (TX_Offset_PLL) as the division RF frequency signal, and the intermediate frequency transmit signal is frequency-converted to the RF transmit frequency signal (fTXVCO) in the frequency band of GSM850 MHz or the frequency band of GSM900 MHz at the transmission system offset PLL circuit (TX_Offset_PLL).

When the semiconductor integrated circuit device forms the RF transmit frequency signal in the frequency band of DCS1800 MHz or the frequency band of PCS1900 MHz, the intermediate frequency transmit signal is formed by the transmitting mixers (TX-MIX_I and TX-MIX_Q) based on the intermediate frequency signals and transmit baseband signals (TxABI and TxABQ), and the first divider (DIV1) is operated as the RF divider (RF DIV), whereby a division output signal of the first divider (DIV1) is transmitted to the other input terminal of the phase control feedback frequency downmixer (DWN_MIX_PM) of the transmission system offset PLL circuit (TX_Offset_PLL) as the division RF frequency signal, and the intermediate frequency transmit signal is frequency-converted to the RF transmit frequency signal (fTXVCO) in the frequency band of DCS1800 MHz or the frequency band of PCS1900 MHz at the transmission system offset PLL circuit (TX_Offset_PLL) (see FIG. 13).

According to the means of the still further specific embodiment of the present invention, the reception/transmission of the four frequency bands of GSM850 MHz, GSM900 MHz, DCS1800 MHz and PCS1900 MHz are enabled.

A semiconductor integrated circuit device for communication according to a still further specific embodiment of the present invention is configured in a polar loop system for adapting to the EDGE (Enhanced Data for GSM Evolution; Enhanced Data for GPRS) system. The transmission system offset PLL circuit (TX_Offset_PLL) includes a phase loop (PM LP) for phase modulation of the polar loop system and an amplitude loop (AM LP) of the polar loop system. The phase comparator (PC), the RF transmission voltage-controlled oscillator (TXVCO) and the phase control feedback frequency downmixer (DWN_MIX_PM) in the transmission system offset PLL circuit (TX_Offset_PLL) constitute the phase loop (PM LP) (see FIG. 14).

According to the means of the still further specific embodiment of the present invention, it is possible to adapt to the EDGE system of the high communication data transfer rate, which makes use of phase modulation and amplitude modulation.

A semiconductor integrated circuit device for communication according to a still further specific embodiment of the present invention includes transmitting mixers (TX-MIX_I and TX-MIX_Q) which form RF transmit signals from transmit baseband signals (TxABI and TxABQ) in response to the RF oscillation output signal having the oscillation frequency (fRFVCO) generated from the RF voltage-controlled oscillator (RFVCO), and a transmission system PLL circuit (PM LP). The transmission system PLL circuit (PM LP) includes a phase comparator (PC) having one input terminal supplied with the RF transmit signals generated from the transmitting mixers (TX-MIX_I and TX-MIX_Q), and the RF transmission voltage-controlled oscillator (TXVCO) which responds to an output of the phase comparator (PC). The RF oscillation output signal generated from the RF transmission voltage-controlled oscillator (TXVCO) is fed back to the other input terminal of the phase comparator (PC) so that the phase of the RF oscillation output signal generated from the RF transmission voltage-controlled oscillator (TXVCO) is controlled by the phase of each of the RF transmit signals generated from the transmitting mixers (TX-MIX_I and TX-MIX_Q). The RF oscillation output signal is formed from the transmit baseband signals (TxABI and TxABQ) by the transmitting mixers (TX-MIX_I and TX-MIX_Q) and the transmission system offset PLL circuit (PM LP) in accordance with a frequency direct up-conversion system (see FIG. 18). In such a manner that the levels of leakage spurious signals caused by mixing at the level converter, of harmonic signal components of the reference frequency signal generated upon level conversion of the level converter (Lev_Conv) and high frequency signal components which have leaked into the level converter (Lev_Conv) and are related to the RF transmit frequency signal having the RF transmit frequency (fTXVCO) generated from the RF transmission voltage-controlled oscillator (TXVCO)

satisfy the GMSK (Gaussian minimum Shift Keying) standard at a frequency (fTXVCO±400 KHz) adjacent to the RF transmit frequency (fTXVCO) generated from the RF transmission voltage-controlled oscillator (TXVCO), the levels of the harmonic signal components generated upon the level conversion of the level converter (Lev_Conv) are suppressed by the self-bias type voltage amplifier (Self_Bias_Volt_Amp) of the level converter (Lev_Conv) (see FIG. 10).

A semiconductor integrated circuit device for communication according to a still further specific embodiment of the present invention is configured in a polar loop system for adapting to the EDGE (Enhanced Data for GSM Evolution; Enhanced Data for GPRS) system. The transmission system offset PLL circuit (PM LP) includes a phase loop (PM LP) for phase modulation of the polar loop system and an amplitude loop (AM LP) of the polar loop system. The phase comparator (PC) and the RF transmission voltage-controlled oscillator (TXVCO) in the transmission system offset PLL circuit (PM LP) constitute the phase loop (PM LP) (see FIG. 18).

A semiconductor integrated circuit device for communication according to the most specific embodiment of the present invention further includes a voltage regulator (DCXO_Vreg) which generates an internal power supply voltage (Vdd_int) by being supplied with an external power supply voltage (Vdd_ext). The phase comparator (PDC) and the RF voltage-controlled oscillator (RFVCO) in the PLL circuit constituting the frequency synthesizer (Frct_Synth) are operated by the external power supply voltage (Vdd_ext), whereas the reference frequency oscillator (DCXO) of the PLL circuit constituting the frequency synthesizer (Frct_Synth) is operated by the internal power supply voltage (Vdd_int) generated from the voltage regulator (DCXO_Vreg). The level converter (Lev_Conv) converts the amplitude level of the oscillation output signal of the reference frequency signal of the reference frequency oscillator (DCXO) operated by the internal power supply voltage (Vdd_int) to the input amplitude level of the phase comparator (PDC) operated at the external power supply voltage (Vdd_ext) (see FIG. 4).

In a semiconductor integrated circuit device for communication according to the most specific embodiment of the present invention, the level converter (Lev_Conv) further includes a double/single signal converter (Dbl_Sing_Conv) which outputs a single end output signal (Vout) by being supplied with double end signals (Vin and /Vin) antiphase to each other, of the reference frequency signal of the reference frequency oscillator (DCXO). The single end output signal (Vout) outputted from the double/single signal converter (Dbl_Sing_Conv) is supplied to the one end of the coupling capacitor (C1) of the self-bias type voltage amplifier (self_Bias_Volt_Amp) (see FIG. 10).

An advantageous effect obtained by a representative one of the inventions disclosed in the present application will briefly be explained as follows:

According to the present invention, when an oscillation output signal of a reference frequency oscillator is supplied by a PLL circuit thereby to control an oscillation frequency of an RF transmission voltage-controlled oscillator by a division ratio of a divider of the PLL circuit, it is possible to reduce the influence of leakage of an oscillation output signal of the RF transmission voltage-controlled oscillator into its neighborhood due to harmonic components of the oscillation output signal of the reference frequency oscillator, which are generated upon level-converting the oscillation output signal of the reference frequency oscillator by a level converter.

BRIEF DESCRIPTION OF THE DRAWINGS

FIG. 6 is a diagram showing ideal frequency characteristics in warmup and transmission modes;

FIG. 7 is a diagram depicting frequency characteristics in warmup and transmission modes for development of an RF IC discussed by the present inventors et al. prior to the present invention;

DETAILED DESCRIPTION OF THE PREFERRED EMBODIMENTS

<<Configuration of Fractional Synthesizer Frct_Synth>>

Figure 1:
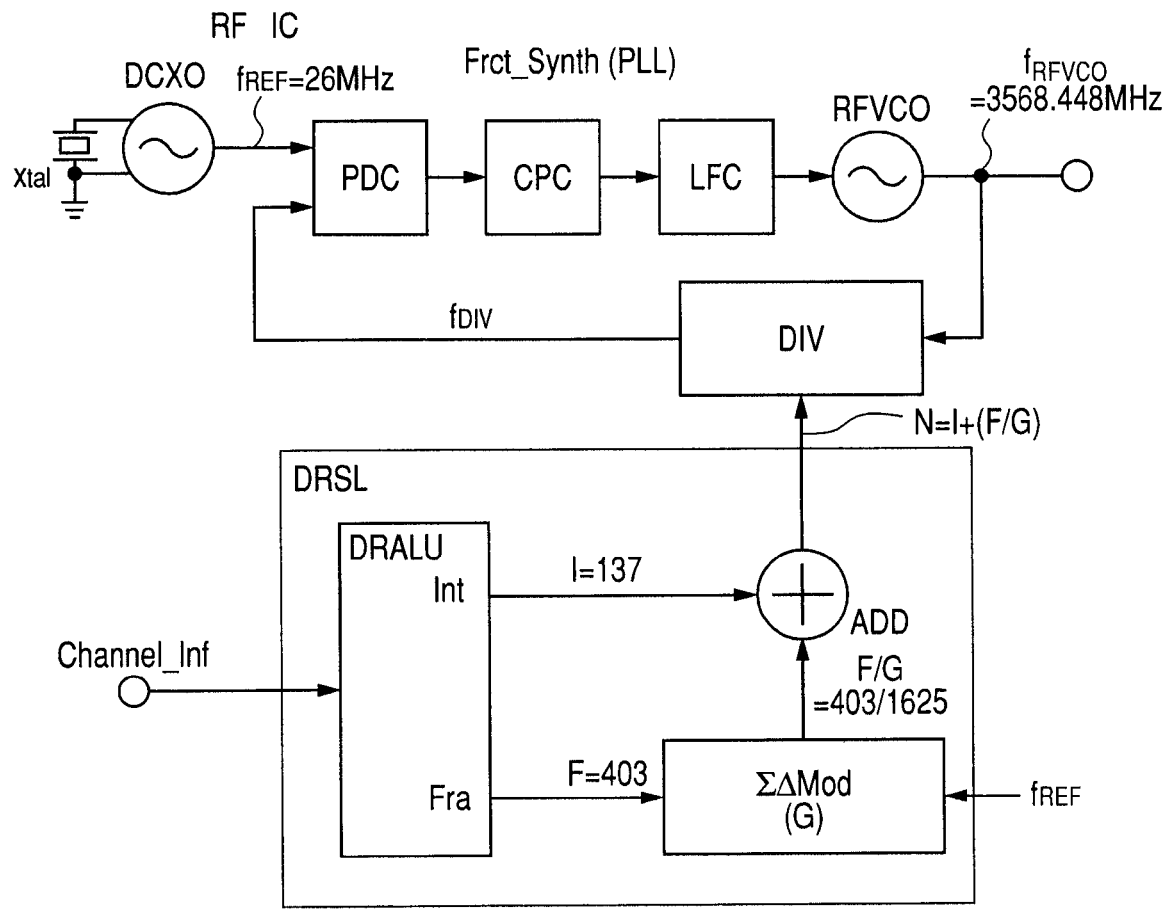
FIG. 1 is a diagram showing a configuration of a fractional synthesizer formed on a chip of a semiconductor integrated circuit device RF IC for communication, according to one embodiment of the present invention.

FIG. 1 is a diagram showing a configuration of a fractional synthesizer Frct_Synth formed on a chip of a semiconductor integrated circuit device RF IC for communication, according to one embodiment of the present invention.

As shown in the same figure, the fractional synthesizer Frct_Synth includes a reference frequency oscillator DCXO set to a stable and accurate reference oscillation frequency fREF by a crystal oscillator Xtal and an automatic frequency control (AFC) signal sent from an unillustrated baseband LSI. The reference oscillation frequency fREF is set to a frequency of 26 MHz, for example. A reference frequency signal having the reference oscillation frequency fREF outputted from the reference frequency oscillator DCXO is supplied to one input terminal of a phase comparator PDC of a fractional PLL circuit. An output of the phase comparator PDC is supplied to an RF voltage-controlled oscillator RFVCO through a charge pump circuit CPC and a low-pass filter LFC. An output of the RF voltage-controlled oscillator RFVCO is supplied to its corresponding input of a divider DIV and a division output signal of the divider DIV is supplied to the other input terminal of the phase comparator PDC. A control input terminal for controlling a division ratio of the divider DIV is connected to a division ratio setting logic DRSL, and the division ratio setting logic DRSL is supplied with channel selection information Channel_inf for RF communication, which is outputted from the unillustrated baseband LSI. The division ratio setting logic DRSL is constituted of a division ratio arithmetic and logical unit DRALU, a $\Sigma\Delta$ modulator $\Sigma\Delta$Mod and an adder ADD. First, an integer unit Int and a fraction unit Fra of the division ratio arithmetic and logical unit DRALU respectively calculate integral value information I and fractional value information F, based on the input channel selection information Channel_inf. The integral value information I outputted from the integer unit Int of the division ratio arithmetic and logical unit DRALU is supplied to one input terminal of the adder ADD, whereas the fractional value information F outputted from the fraction unit Fra of the division ratio arithmetic and logical unit DRALU is supplied to the $\Sigma\Delta$ modulator $\Sigma\Delta$Mod. The reference frequency signal outputted from the reference frequency oscillator DCXO is further supplied to the $\Sigma\Delta$ modulator $\Sigma\Delta$Mod as an operation clock signal. On the other hand, the $\Sigma\Delta$ modulator $\Sigma\Delta$Mod holds denominator information G for setting a division ratio therein as internal information. As one example, the denominator information G has been set to 1625. The $\Sigma\Delta$ modulator $\Sigma\Delta$Mod generates the fractional value information F+the denominator information G, as one example, an output signal F/G having information about a fraction of $^{403}/_{1625}$ from the fractional value information F and the denominator information G and supplies it to the other input terminal of the adder ADD. The adder ADD supplies output information about I+F/G obtained from the integral value information I (I=137 as one example) and the output signal F/G, as one example, 137+($^{403}/_{1625}$)=137.248 to the divider DIV as a mean or average division ratio N. As a result, the average division ratio of the divider DIV is set to a value containing 137.248, an integer and a fraction (decimal fraction). Thus, the factional synthesizer Frct_Synth generates an RF oscillation output signal having an oscillation frequency fRFVCO of 3568.448 MHz obtained by multiplying 26 MHz of the reference oscillation frequency fREF outputted from the reference frequency oscillator DCXO by the average division ratio N (137.248). The average division ratio N will be described in detail. In response to the integral value information I (I=137) outputted from the integer unit Int of the division ratio arithmetic and logical unit DRALU and an overflow 1-bit output generated at the frequency ($^{403}/_{1625}$) corresponding to the output signal F/G outputted from the $\Sigma\Delta$ modulator $\Sigma\Delta$Mod, the division ratio n f the divider DIV is changed from n (=I=137) to n+1 (=I+1=138). Thus, the frequency at which the division ratio n of the divider DIV reaches n (=I=137) is $^{1222}/_{1625}$=75.2%, and the frequency at which the division ratio of the divider DIV reaches n+1 (=I+1=138) is $^{403}/_{1625}$=24.8%. Thus, the average division ratio N results in 137×0.752+138×0.248=137.248.

Figure 2:
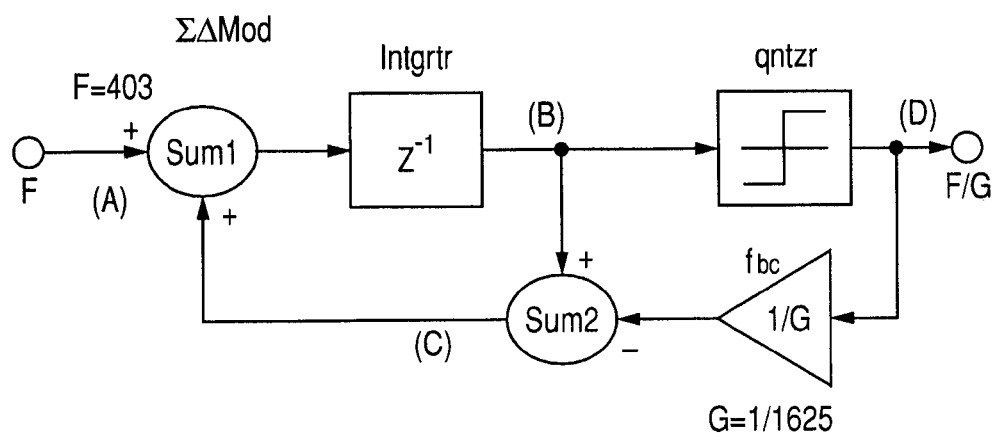
FIG. 2 is a diagram showing a configuration of a ΣΔ modulator of the fractional synthesizer shown in FIG. 1.

FIG. 2 is a diagram showing a configuration of the $\Sigma\Delta$ modulator $\Sigma\Delta$Mod of the fractional synthesizer Frct_Synth shown in FIG. 1.

As shown in the same figure, the fractional value information F outputted from the fraction unit Fra of the division ratio arithmetic and logical unit DRALU is supplied to one input terminal (A) of a first adder Sum1, whereas an output signal (C) of a second adder Sum2 to be described later is supplied to the other input terminal of the first adder Sum1. An output signal of the first adder Sum1 is supplied to a delay circuit configured as an integrator Intgrtr, and an output signal (B) of the integrator Intgrtr is supplied to the input of a 1-bit output quantizer qntzr. The output signal (B) of the integrator Intgrtr is supplied to the input of a feedback circuit fbc having predetermined gain 1/G. The inverse G of the gain 1/G corresponds to the denominator information G (G=1625 as one example) for setting the division ratio, which is held as the internal information by the $\Sigma\Delta$ modulator $\Sigma\Delta$Mod. Accordingly, the output of the feedback fbc becomes zero in a non-overflow state in which a 1-bit output signal (D) of the quantizer qntzr is "0", whereas the output of the feedback circuit fbc becomes 1625 in an overflow state in which the 1-bit output signal (D) of the quantizer qntzr is "1". Thus, when the overflow state in which the 1-bit output signal (D) of the quantizer qntzr is "1", occurs, the second adder Sum2 executes subtraction of the output 1625 of the feedback circuit fbc from accumulative addition of the output signal (B) of the integrator Intgrtr. Further, the output signal (C) of the second adder Sum2 is supplied to the other input terminal of the first adder Sum1. The 1-bit output signal (D) of the quantizer qntzr, which is indicative of the non-overflow state/overflow state is supplied to the adder ADD as an output signal F/G of the $\Sigma\Delta$ modulator $\Sigma\Delta$Mod.

Figure 3:
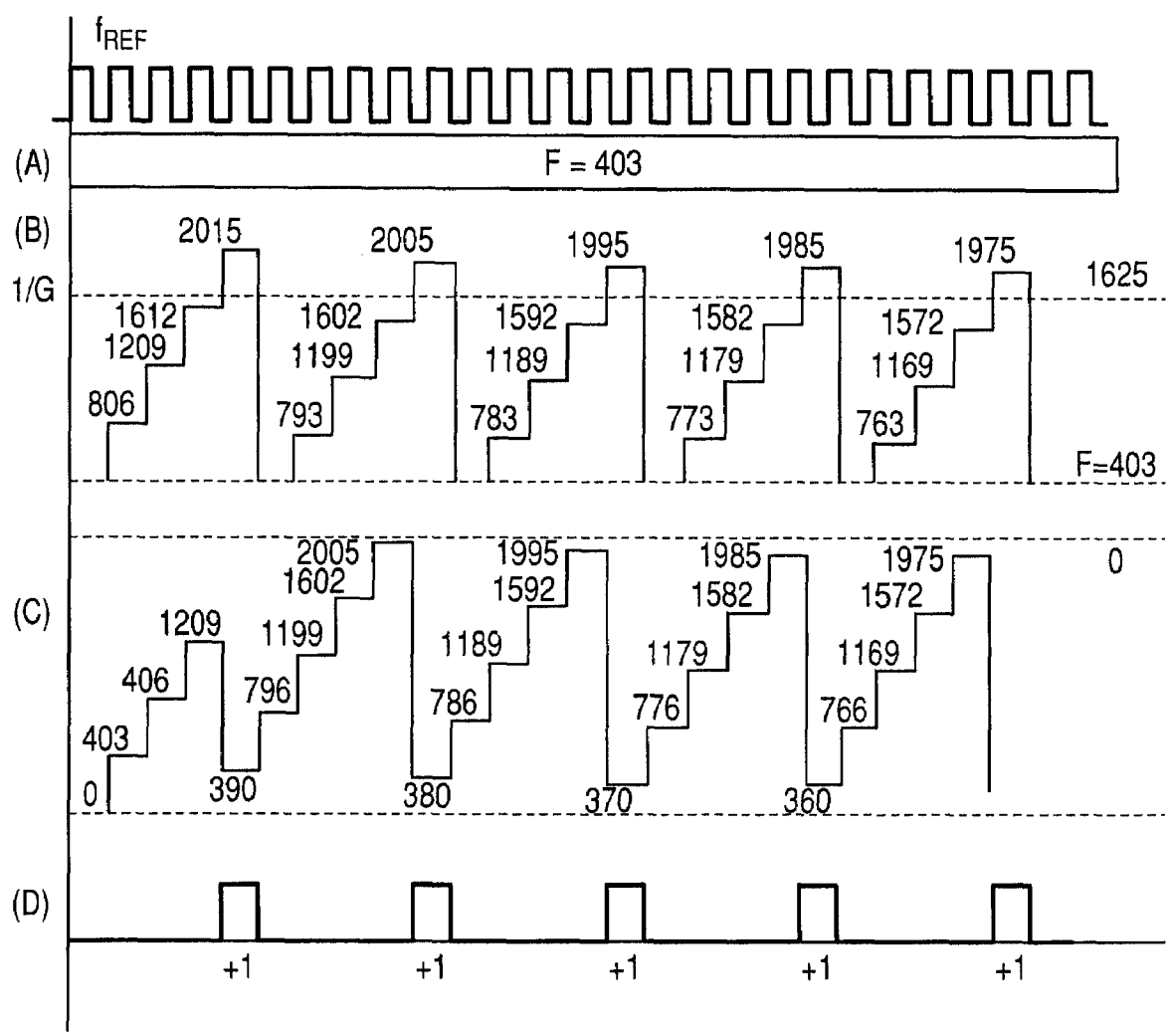
FIG. 3 is a diagram showing the operation of the ΣΔ modulator of the fractional synthesizer shown in FIG. 2.

FIG. 3 is a diagram showing the operation of the EA modulator $\Sigma\Delta$Mod of the fractional synthesizer Frct_Synth shown in FIG. 2.

As shown in the same figure, the reference frequency signal having the reference frequency fREF outputted from the reference frequency oscillator DCXO is supplied to the $\Sigma\Delta$ modulator $\Sigma\Delta$Mod as an operation clock signal. As shown in FIG. 3(A), the fractional value information F is supplied to the one input terminal of the first adder Sum1 of the $\Sigma\Delta$ modulator $\Sigma\Delta$Mod on a stationary basis. Thus, a first result of accumulative addition is obtained from the output of the integrator Intgrtr in a cycle of the operation clock signal. As shown in FIG. 3(B), a fourth result of accumulative addition is obtained from the output of the integrator Intgrtr in a fourth cycle of the operation clock signal. In the fourth cycle of the operation clock signal as shown in FIG. 3(D), the overflow state of "1" appears at the 1-bit output signal of the quantizer qntzr. In doing so, as shown in FIG. 3(C), the second adder Sum2 executes subtraction of the output 1625 of the feedback circuit fbc from accumulative addition of the output of the integrator Intgrtr. Incidentally, the quantizer qntzr outputs a 1-bit output signal indicative of the non-overflow state of "0" when the input signal ranges from 0 to 1624. On the other hand, when the input signal is 1625 or a value greater than it, the quantizer qntzr outputs a 1-bit output signal indicative of the overflow state of "1". The above operations are repeated in response to the operation clock signal fREF. Thus, the 1-bit output signal indicative of the overflow state of "1" is generated from the quantizer qntzr at the frequency of the fractional information F/G ($403/1625$) outputted from the ΣΔ modulator ΣΔMod.

The output signal (D) of the quantizer qntzr shown in FIG. 2, i.e., the 1-bit output signal F/G of the ΣΔ modulator ΣΔMod is supplied to the adder of the division ratio setting logic DRSL shown in FIG. 1, where it is added to the integral value information I supplied from the integer unit Int of the division ratio arithmetic and logical unit DRALU. When the 1-bit output signal of the ΣΔ modulator ΣΔMod is of the non-overflow state of "0", the division ratio n of the divider DIV of the fractional synthesizer Frct_Synth is set to integral value information I (I=137). When the 1-bit output signal of the ΣΔ modulator ΣΔMod is of the overflow state of "1", the division ratio n of the divider DIV of the fractional synthesizer Frct_Synth is set to (n+1) (=(I+1)=138). As a result, the average division ratio N reaches 137.248.

Figure 4:
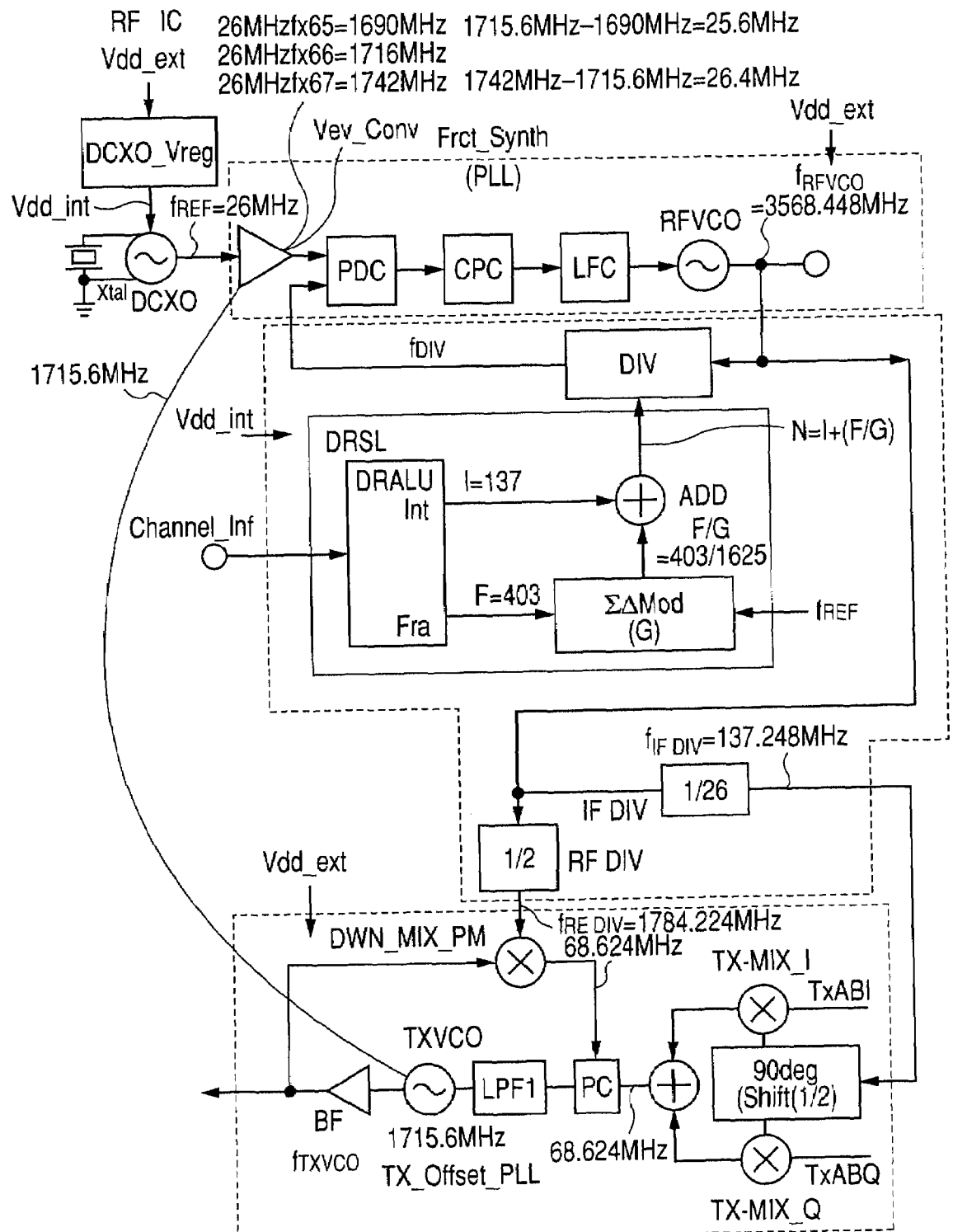
FIG. 4 is a diagram for describing frequency control of a transmission system signal processing subunit of the semiconductor integrated circuit device RF IC for communication, using the fractional synthesizer including a reference frequency oscillator shown in FIG. 1.

FIG. 4 is a diagram for describing an embodiment for carrying out frequency control of a transmission system signal processing subunit of the semiconductor integrated circuit device RF IC for communication, using the fractional synthesizer Frct_Synth containing the reference frequency oscillator DCXO shown in FIG. 1. The transmission system signal processing subunit includes a transmission system offset PLL circuit TX_Offset_PLL. An RF oscillation output signal of an oscillation frequency fRFVCO (3568.448 MHz) corresponding to the output of the RF voltage-controlled oscillator RFVCO of the fractional synthesizer Frct_Synth is supplied to an intermediate frequency divider IF DIV set to a division ratio 26, so that a double (137.248 MHz) intermediate frequency signal (137.248 MHz) is formed from the output of the intermediate frequency divider IF DIV. The double intermediate frequency signal (137.248 MHz) is supplied to the input of a 90° phase shifter 90degShift so that two intermediate frequency signals (68.624 MHz) different 90° in phase are formed. Transmitting mixers TX-MIX_I and TX-MIX_Q are respectively supplied with baseband transmit signals TxABI and TxABQ and the two intermediate frequency signals (68.624 MHz) different 90° in phase, so that a vector-combined intermediate frequency transmit signal (68.624 MHz) is formed at the output of an adder connected to the outputs of the transmitting mixers TX-MIX_I and TX-MIX_Q. The intermediate frequency transmit signal (68.624 MHz) is supplied to one input terminal of a phase comparator PC. An output of the phase comparator PC is supplied to its corresponding RF transmission voltage-controlled oscillator TXVCO via a low-pass filter LF1 so that the frequency of the RF transmission voltage-controlled oscillator TXVCO is controlled to approximately 1715.6 MHz. An oscillation output signal of the RF transmission voltage-controlled oscillator TXVCO is supplied to one input terminal of a phase control feedback frequency downmixer DWN_MIX_PM via a buffer amplifier BF, and a downmixer RF signal (1784.224 MHz) sent from an RF divider RF DIV set to a division ratio 2 is supplied to the other input terminal of the phase control feedback frequency downmixer DWN_MIX_PM. The phase control feedback frequency downmixer DWN_MIX_PM mixes an oscillation signal (approximately 1715.6 MHz) outputted from the RF transmission voltage-controlled oscillator TXVCO and the downmixer RF signal (1784.224 MHz) outputted from the RF divider RF DIV. Thus, a feedback signal of 1784.224 MHz–1715.6 MHz=68.624 MHz corresponding to a differential frequency is formed from the output of the phase control feedback frequency downmixer DWN_MIX_PM and supplied to the other input terminal of the phase comparator PC. The transmission system offset PLL circuit TX_Offset_PLL performs negative feedback control in such a manner that the two input signals of the phase comparator PC coincide with each other in phase and frequency. As a result, a signal having an RF transmit frequency fTXVCO of accurate 1715.6 MHz is obtained from the RF transmission voltage-controlled oscillator TXVCO. An intermediate frequency transmit signal fIF (68.624 MHz) vector-combined at the output of the adder connected to the outputs of the transmitting mixers TX-MIX_I and TX-MIX_Q is supplied to one input terminal of the phase comparator PC. Further, the other input terminal of the phase comparator PC is supplied with a difference frequency signal (fRFVCO/2-fTXVCO) obtained by subtracting the frequency fTXVCO of the RF transmit frequency signal of the RF transmission voltage-controlled oscillator TXVCO from a division RF oscillation frequency fRFVCO/2 obtained by dividing the oscillation frequency fRFVCO of the RF voltage-controlled oscillator RFVCO by a division ratio 2. Since the reference frequency at the one input terminal of the phase comparator PC and the negative feedback frequency at the other input terminal of the phase comparator PC coincide with each other by the negative feedback control of the transmission system offset PLL circuit TX_Offset_PLL, the following relationship is established:

$$fIF = fRFVCO/2 - fTXVCO \qquad (1)$$

Modifying the above equation yields the following equation:

$$\begin{aligned} fTXVCO &= fRFVCO/2 - fIF \qquad (2) \\ &= (3568.448 \text{ MHz}/2) - 68.624 \text{ MHz} \\ &= 1784.224 \text{ MHz} - 68.624 \text{ MHz} \\ &= 1715.6 \text{ MHz} \end{aligned}$$

Thus, the RF transmit frequency fTXVCO generated from the RF transmission voltage-controlled oscillator TXVCO is accurately set in response to the oscillation frequency fRFVCO of the RF oscillation output signal generated from the RF voltage-controlled oscillator RFVCO of the transmission system offset PLL circuit TX_Offset_PLL and the intermediate frequency transmit signal fIF of the output of the adder connected to the output of the transmission or transmitting mixer.

As shown in FIG. 4, the RF IC is supplied with an external power supply voltage Vdd_ext having a fluctuation range from 2.7 volts to 3.0 volts. The external power supply voltage Vdd_ext is supplied even to an on-chip voltage regulator DCXO_Vreg. An internal stabilized power supply voltage Vdd_int maintained at a stable value of approximately 2.2 volts generated from the on-chip voltage regulator DCXO_Vreg is supplied to the reference frequency oscillator DCXO, so that a reference frequency signal having a reference oscillation frequency fREF of 26 MHz accurately set stably from the reference frequency oscillator DCXO is formed by a crystal oscillator Xtal and an automatic frequency control (AFC) signal from a baseband LSI. Thus, if the internal stabilized power supply voltage Vdd_int maintained at the stable value is supplied to the reference frequency oscillator DCXO, then the reference oscillation frequency fREF of the reference frequency oscillator DCXO is not varied by the external power supply voltage Vdd_ext. Therefore, it reaches the accurately set reference oscillation frequency fREF of 26 MHz. Accordingly, even though the internal stabilized power supply voltage Vdd_int generated from the on-chip voltage regulator DCXO_Vreg is not supplied to the fractional PLL circuit and transmission system offset PLL circuit TX_Offset_PLL of the RF IC, the oscillation frequency fTXVCO of the RF transmission voltage-controlled oscillator TXVCO can be stably maintained by the fractional PLL circuit at a frequency multiplication ratio corresponding to the inverse of a fractional division ratio N. The fractional PLL circuit includes the RF voltage-controlled oscillator RFVCO for generating an RF carrier signal, which is used in frequency downconversion from an RF receive signal to a baseband receive signal at a reception system signal processing subunit of the RF IC and frequency upcoversion from a baseband transmit signal to an intermediate frequency transmit signal or RF transmit signal at the transmission system signal processing subunit of the RF IC. By setting the oscillation frequency of the RF voltage-controlled oscillator RFVCO of the fractional PLL circuit by fractional division, the oscillation frequency of the RF transmission voltage-controlled oscillator TXVCO is finally set. Since the RF voltage-controlled oscillator RFVCO is relatively large in current consumption and the RF transmission voltage-controlled oscillator TXVCO is also larger in current consumption, the current used up or consumed by the RF voltage-controlled oscillator RFVCO and the current consumed by the RF transmission voltage-controlled oscillator TXVCO are supplied directly from the external power supply voltage without being supplied from the on-chip voltage regulator. On the other hand, the digitally-operated circuit sections such as the divider DIV, division ratio setting logic DRSL, RF divider RF DIV, intermediate frequency divider IF DIV, etc. in the fractional PLL circuit are supplied with the internal stabilized power supply voltage Vdd_int of approximately 2.2 volts generated from the on-chip voltage regulator DCXO_Vreg as shown in FIG. 4.

On the other hand, the level converter Lev_Conv connected to the oscillation output of the reference frequency oscillator DCXO level-converts an oscillation voltage signal of a low voltage of 2.2 volts of the reference frequency oscillator DCXO to a high voltage ranging from 2.7 volts to 3.0 volts and supplies the level-converted reference frequency information of the reference frequency oscillator DCXO to one input terminal of the phase comparator PDC of the fractional PLL circuit.

<<Configuration of Level Converter Discussed in the Middle of Development of RF IC Preceding the Present Invention>>

Figure 5:
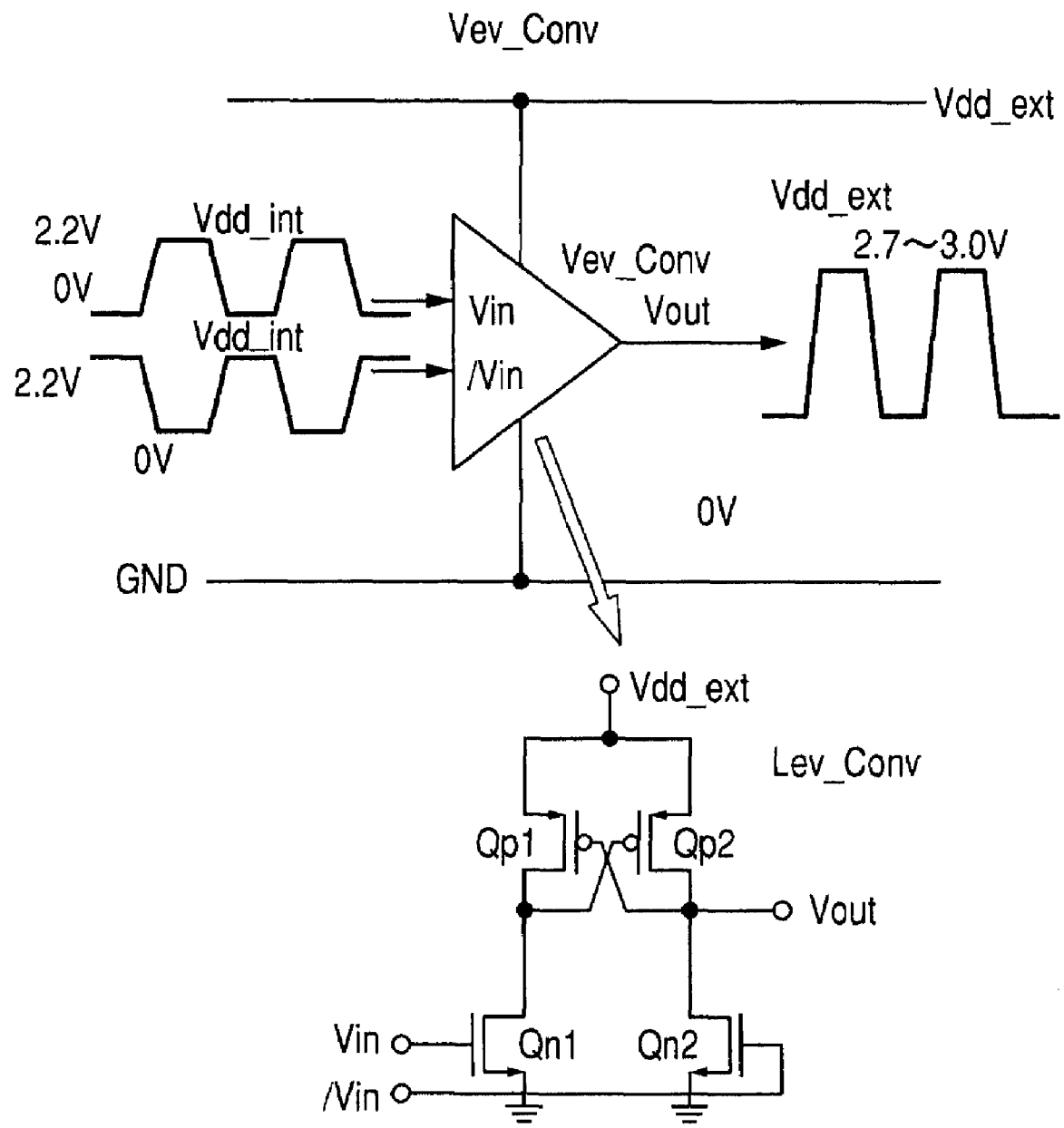
FIG. 5 shows a configuration of a level converter discussed by the present inventors et al. in the middle of development of an RF IC preceding the present invention.

FIG. 5 shows a configuration of a level converter Lev_Conv discussed by the present inventors et al. in the middle of development of an RF IC preceding the present invention. Double end oscillation output signals antiphase to each other from the reference frequency oscillator DCXO shown in FIG. 4 are supplied to their corresponding input terminals Vin and /Vin of the level converter Lev_Conv. Voltage amplitudes of the antiphase double end oscillation output signals at the input terminals Vin and /Vin respectively correspond to the internal stabilized power supply voltage Vdd_int of approximately 2.2 volts generated from the on-chip voltage regulator DCXO_Vreg, which is supplied to the reference frequency oscillator DCXO. As shown in FIG. 5, the antiphase double end oscillation output signals at the input terminals Vin and /Vin are supplied to their corresponding gates of N channel MOS transistors Qn1 and Qn2 of which the sources are grounded. The drains of the N channel MOS transistors Qn1 and Qn2 are connected to their corresponding drains of cross-coupled P channel MOS transistors Qp1 and Qp2. The sources of the cross-coupled P channel MOS transistors Qp1 and Qp2 are respectively supplied with an external power supply voltage fluctuation Vdd_ext ranging from 2.7 volts to 3.0 volts supplied to the phase comparator PC of the fractional PLL circuit. When the input terminal Vin is of a high level having low amplitude and the input terminal /Vin is of a low level having low amplitude, the Qn1 and Qp2 are respectively brought to an on state and the Qn2 and Qp1 are respectively brought to an off state. Therefore, a high level output having high amplitude corresponding to the external power supply voltage fluctuation Vdd_ext is obtained from an output terminal VOUT of the level converter Lev_Conv via a source-to-drain path of the Qp2 held in the on state. When the input terminal Vin is of a low level having low amplitude and the input terminal /Vin is of a high level having low amplitude, the on-off states of the transistors are reversed from the above. Therefore, a low level output having high amplitude corresponding to a ground level is obtained from the output terminal VOUT of the level converter Lev_Conv.

It has however been cleared by the present inventors et al. that upon level-converting the oscillation output voltage amplitude of the reference frequency oscillator DCXO by the level converter Lev_Conv shown in FIG. 5, the level converter Lev_Conv generates not only fundamental frequency components of 26 MHz of the reference oscillation frequency of the reference frequency oscillator DCXO but also harmonic components of 26 MHz. It has also been made apparent that spurious signals (unwanted interference signals) leak into neighboring frequency components of an RF transmit frequency fTXVCO of an RF transmit frequency signal corresponding to an output signal of the RF transmission voltage-controlled oscillator TXVCO of the transmission system offset PLL circuit TX_Offset_PLL.

<<Mechanism of Generation of Spurious Signals Based on Harmonic Components Generated at Level Converter>>

The RF IC developed prior to the present invention corresponds to a GSM system. In communications using the GSM system, there has been adopted a TDMA system which has time slots corresponding to communication units delimited by predetermined time intervals at a communication terminal like a cellular phone and which is capable of setting the individual time slots of the plural time slots to any of an idle state, a receiving operation from a base station and a transmitting operation for the base station. Incidentally, TDMA is an abbreviation of Time-Division Multiple Access.

The idle state is also called "warm-up mode". A frequency characteristic in an ideal warm-up mode Warm-up mode of FIG. 6(1) indicates that only the reference frequency oscillator DCXO having the reference oscillation frequency fREF of 26 MHz and the RF voltage-controlled oscillator RFVCO having the oscillation frequency fRFVCO of 3568.448 MHz in the fractional PLL circuit are operated in the RF IC shown in FIG. 4. FIG. 7(1) shows a frequency characteristic in an actual warm-up mode Warm-up mode in the RF IC being in the middle of its development. The frequency characteristic is not different from the frequency characteristic in the ideal warm-up mode Warm-up mode shown in FIG. 6(1).

A frequency characteristic in an ideal transmission mode TX mode of FIG. 6(2) indicates that upon the operation of transmission to the base station, the reference frequency oscillator DCXO having the reference oscillation frequency fREF of 26 MHz, the RF transmission voltage-controlled oscillator TXVCO having the RF transmit frequency fTXVCO of 1715.6 MHz and the RF voltage-controlled oscillator RFVCO having the oscillation frequency fRFVCO of 3568.448 MHz in the fractional PPLL circuit are operated in the RF IC shown in FIG. 4. FIG. 7(2) shows a frequency characteristic in an actual transmission mode TX mode at the RF IC being in the middle of its development. In the figure, various spurious signals (unwanted interference signals) being nonexistent in the frequency characteristic in the ideal transmission mode TX mode of FIG. 6(2) are generated. The mechanism of generation of such spurious signals will be explained below.

As shown in FIG. 4, high frequency signal components of an oscillation frequency fTXVCO of 1715.6 MHz from the RF transmission voltage-controlled oscillator TXVCO first leak into the level converter Lev_Conv. This is because in the RF IC, a large number of RF circuits are fabricated in an extremely small semiconductor chip by a device process technology with an ultra packaging density. It is substantially not possible to perform sufficient isolation of high frequency signal components in such a manner that the high frequency signal components of 1715.6 MHz close to an RF frequency of 2 GHz are not coupled between the large number of RF circuits on the semiconductor chip. As a result, the level converter Lev_Conv shown in FIG. 5 performs mixing of a harmonic (1690 MHz) equal to 65 times the reference oscillation frequency (26 MHz) of the reference frequency oscillator DCXO, which is generated at the level converter Lev_Conv and high frequency signal components of the leaked RF transmit frequency fTXVCO of 1715.6 MHz, and mixing of a harmonic (1742 MHz) equal to 67 times the reference oscillation frequency (26 MHz) from the reference frequency oscillator DCXO, which is generated at the level converter Lev_Conv and the high frequency signal components of the leaked RF transmit frequency fTXVCO of 1715.6 MHz. As a result of such mixing, the following two spurious signals (unwanted interference signals) each having a difference frequency are formed in proximity to the reference oscillation frequency fREF of 26 MHz corresponding to the output signal of the reference frequency oscillator DCXO by the level converter Lev_Conv.

1715.6 MHz−65×26 MHz=1715.6 MHz−1690 MHz=25.6 MHz

67×26 MHz−1715.6 MHz=1742 MHz−1715.6 MHz=26.4 MHz

Figure 19:
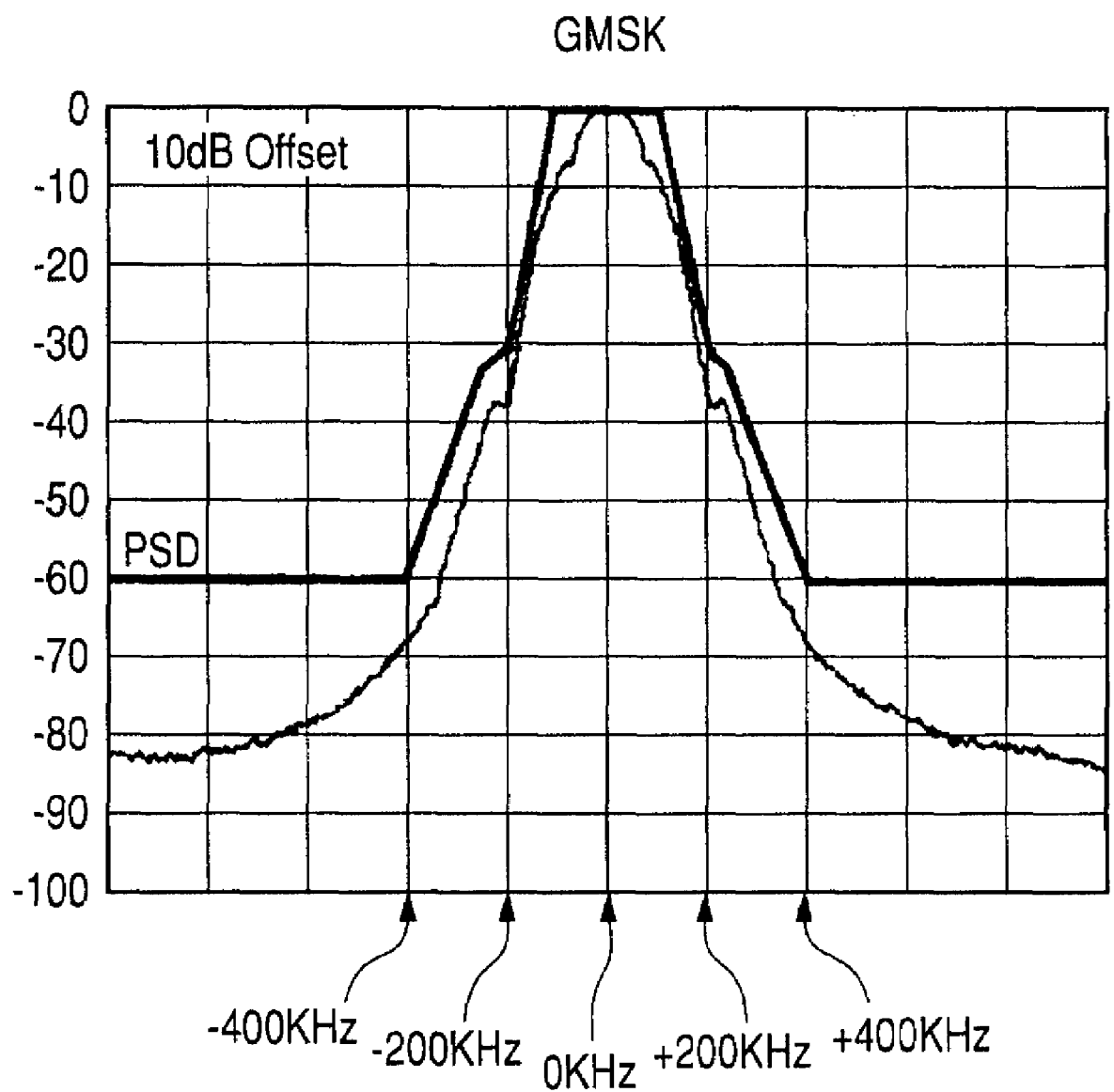
FIG. 19 is a diagram showing a frequency spectrum of an RF transmit signal of a cellular phone terminal defined based on a GMSK standard.

That is, the two spurious signals (unwanted interference signals) of 25.6 MHz and 26.4 MHz formed in proximity to the reference oscillation frequency fREF of 26 MHz generated from the reference frequency oscillator DCXO are formed by the level converter Lev_Conv. The generation of the spurious signals becomes equivalent to the fact that the reference oscillation frequency fREF of 26 MHz corresponding to the output signal of the reference frequency oscillator DCXO is frequency-modulated with a width±0.4 MHz=±400 KHz. As a result, two spurious signals (unwanted interference signals) of 1715.6 MHz−400 KHz=1715.2 MHz and 1715.6 MHz+400 KHz=1716 MHz are generated at the RF transmission voltage-controlled oscillator TXVCO in proximity to the RF transmit frequency fTXVCO of 1715.6 MHz corresponding to the output signal of the RF transmission voltage-controlled oscillator TXVCO. The two leakage spurious signal components are finally power-amplified by an RF power amplifier connected to the output of the transmission system signal processing subunit of the RF IC, followed by being transmitted as adjacent interference signals through an antenna of a cellular phone terminal. The leakage spurious signal components of the RF transmit frequency fTXVCO of 1715.6 MHz corresponding to the output signal of the RF transmission voltage-controlled oscillator TXVCO±400 KHz are strictly defined to less than or equal to a predetermined value (−60 dBm) by the GMSK (Gaussian minimum Shift Keying) standard. FIG. 19 shows a frequency spectrum of an RF transmit signal of a cellular phone terminal, which is defined by the GMSK standard. A thick or bold line PSD is a level defined by the GMSK standard. Attenuation at the proximity of the center frequency (RF transmit frequency)±200 KHz is defined to less than or equal to −30 dBm, and attenuation at the proximity of the center frequency (RF transmit frequency)±400 KHz is defined to less than or equal to −60 dBm. A thin solid line indicates an example that satisfies the present standard.

Incidentally, a harmonic (1716 MHz) equivalent to 66 times as large as 26 MHz of the reference oscillation frequency of the reference frequency oscillator DCXO is also generated from the level converter Lev_Conv. The level converter Lev_Conv performs mixing of the RF oscillation signal having the RF transmit oscillation frequency fTXVCO of 1715.6 MHz from the RF transmission voltage-controlled oscillator TXVCO and the 66-times harmonic (1716 MHz).

66×26 MHz−1715.6 MHz=1716 MHz−1715.6 MHz=0.4 MHz

Since, however, the difference frequency 0.4 MHz markedly differs from the reference oscillation frequency fREF of 26 MHz generated from the reference frequency oscillator DCXO, there is no substantial adverse effect due to the 66-times harmonic (1716 MHz).

It is estimated that the harmonics are generated from the level converter Lev_Conv shown in FIG. 5 because a duty ratio between a high level period and a low level period of an output signal VOUT varies with fluctuations of 2.7 volts to 3.0 volts of the external power supply voltage Vdd_ext due to the following reasons. That is, the output signal VOUT changes to a low level because a load capacitance at an output VOUT is discharged by a current that flows through the Qn2 according to the turning on of the N channel MOS transistor Qn2 connected to the output VOUT. A variation in the current of the Qn2 due to the variations in external power supply voltage Vdd_ext is small and a variation in the rate of change of the output signal VOUT to the low level is also small. However, the changing of the output signal VOUT to a high level results from the fact that a load capacitance at the output VOUT is charged by a current that flows through the Qp2 according to the turning on of the P channel MOS transistor Qp2 connected to the output VOUT. In order to turn on the Qp2, the N channel MOS transistor Qn1 is turned on and the potential applied to the gate of the Qp2 is pulled down. On the other hand, the source of the Qp2 is supplied with the external power supply voltage Vdd_ext having the fluctuation range from 2.7 volts to 3.0 volts. Thus, a variation in the charging current that flows through the Qp2 due to the variations in the external power supply voltage Vdd_ext is large, and a change in the rate of change of the output signal VOUT to the high level is also large.

Figure 8:
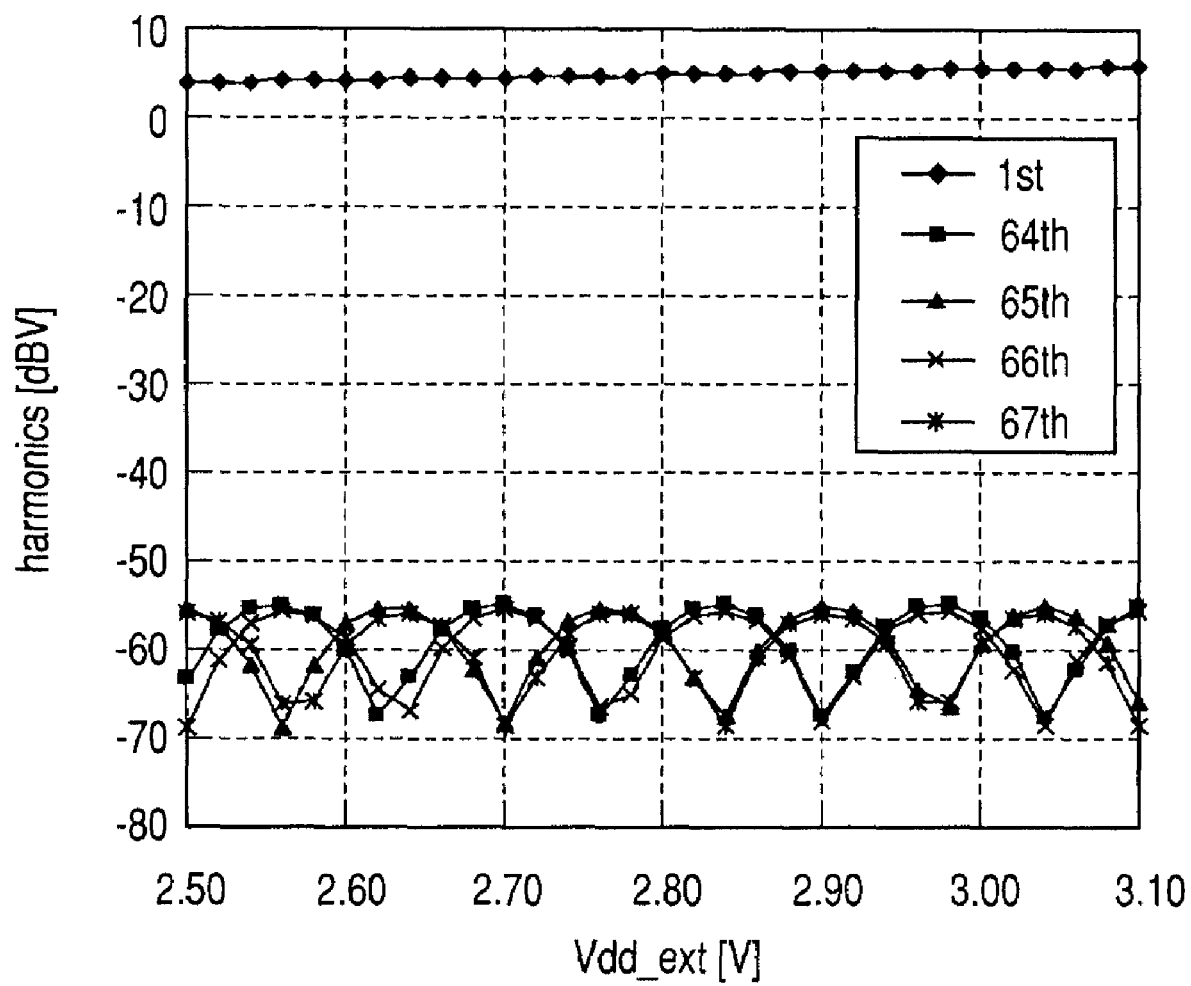
FIG. 8 is a result of simulation indicating that the levels of various harmonics produced from the level converter shown in FIG. 5 vary depending on variations in external power supply voltage.

FIG. 8 is a result of simulation indicating that the levels of the various harmonics generated from the level converter Lev_Conv shown in FIG. 5 vary depending on the variations in the external power supply voltage Vdd_ext. In FIG. 8, the horizontal axis indicates the level of the external power supply voltage Vdd_ext, the vertical axis indicates the levels of the various harmonics, 1st indicates the level of a fundamental component of a frequency 26 MHz of a reference frequency signal corresponding to an output signal of the reference frequency oscillator DCXO, 64th indicates the level of a 64-times harmonic, 65th indicates the level of a 65-times harmonic, 66th indicates a 66-times harmonic, and 67th indicates a 67-times harmonic, respectively. Even-numbered harmonics of the 64-times harmonic and the 66-times harmonic become a low level in the neighborhood of 2.50 volts and 2.62 volts of the external power supply voltage Vdd_ext and become a high level in the neighborhood of 2.56 volts, respectively. In reverse, odd-numbered harmonics of the 65-times harmonic and the 67-time harmonic become a high level in the neighborhood of 2.50 volts and 2.62 volts of the external power supply voltage Vdd_ext and become a low level in the neighborhood of 2.56 volts, respectively.

Figure 9:
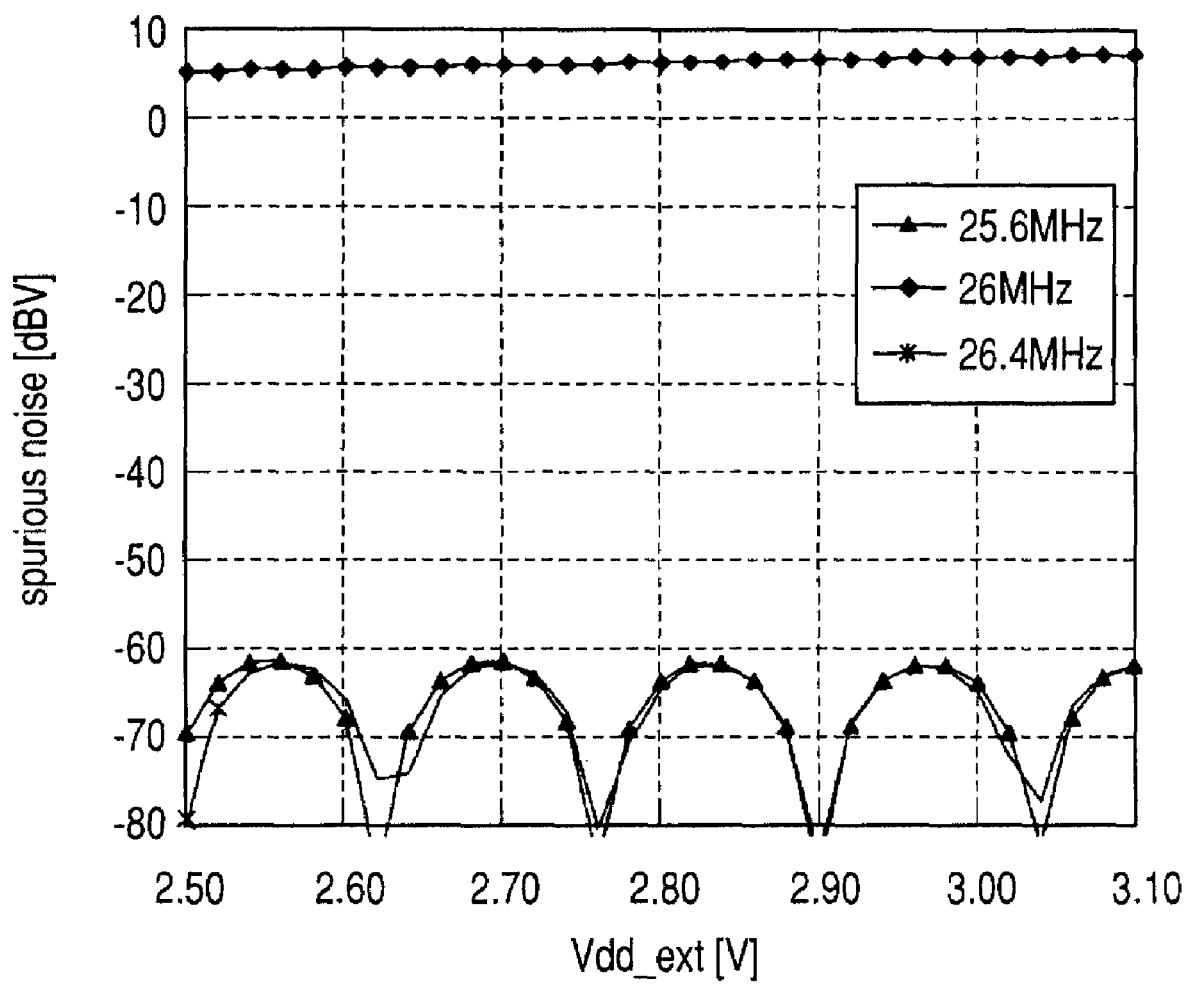
FIG. 9 is a result of simulation indicating the levels of two spurious signals of 25.6 MHz and 26.4 MHz formed by the level converter where the level converter shown in FIG. 5 is used.

FIG. 9 is a result of simulation showing the levels of two spurious signals (unwanted interference signals) of 25.6 MHz and 26.4 MHz formed by the level converter Lev_Conv where the level converter Lev_Conv shown in FIG. 5 is used. Incidentally, in FIG. 9, the horizontal axis indicates the level of an external power supply voltage Vdd_ext, and the vertical axis indicates the level of a signal. 26 MHz indicates a signal level of a reference oscillation frequency fREF of 26 MHz generated from the reference frequency oscillator DCXO. Both of two spurious signals (unwanted interference signals) of 25.6 MHz and 26.4 MHz become a low level in the neighborhood of 2.50 volts and 2.62 volts and become a high level in the neighborhood of 2.56 volts.

<<Configuration of Level Converter According to Embodiment of the Present Invention>>

Figure 10:
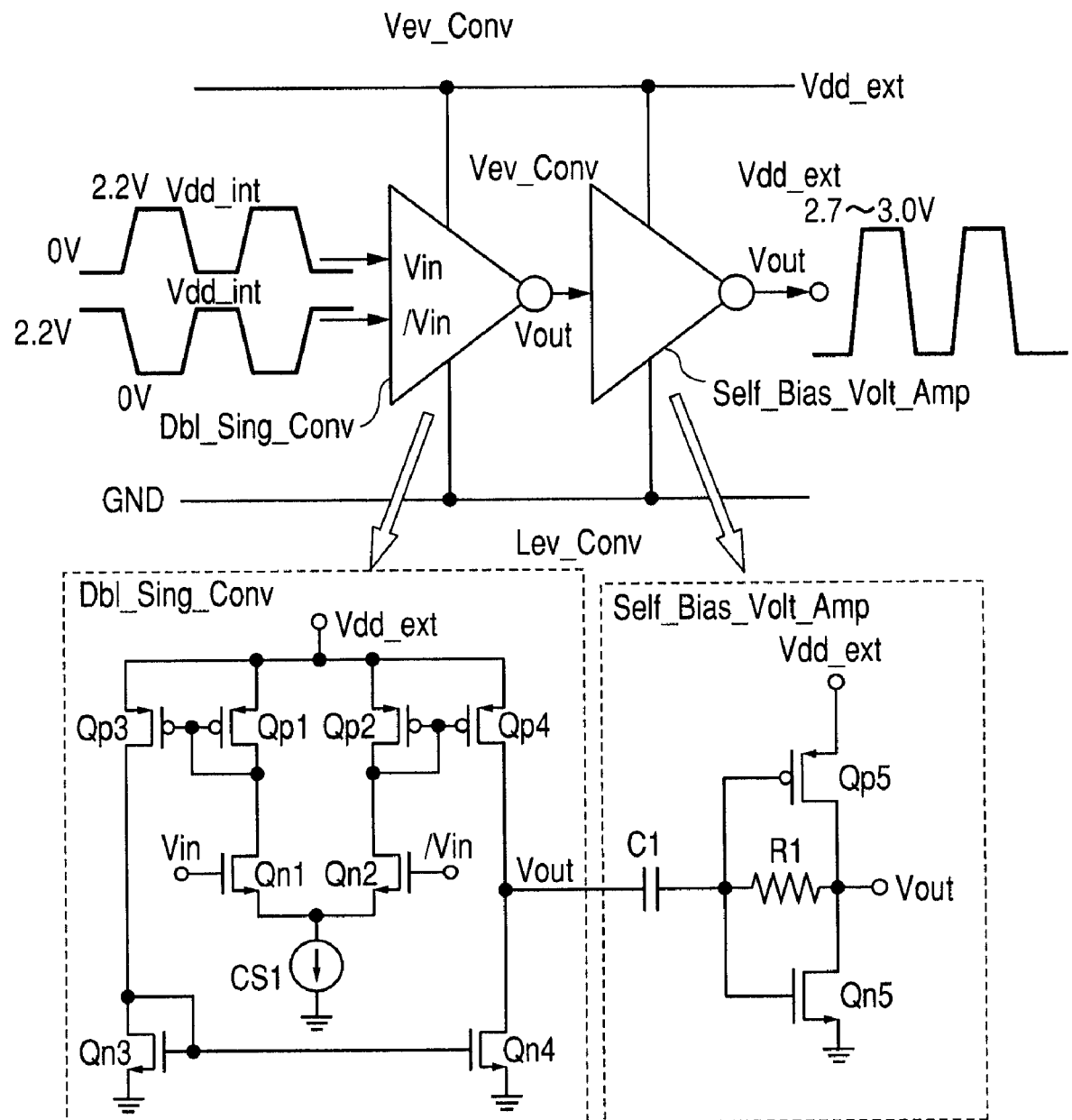
FIG. 10 shows a circuit configuration of a level converter according to one embodiment of the present invention.

FIG. 10 shows a circuit configuration of a level converter Lev_Conv according to one embodiment of the present invention. The level converter Lev_Conv shown in FIG. 10 includes a double/single signal converter Dbl_Sing_Conv which outputs a single end output signal Vout by being supplied with double end signals Vin and /Vin of a reference frequency signal of a reference frequency oscillator DCXO, and a voltage amplifier which amplifies the single end output signal Vout of the double/single signal converter Dbl_Sing_Conv. The voltage amplifier is configured in a circuit form of a self-bias type voltage amplifier Self_Bias_Volt_Amp including a coupling capacitor C1 having one end supplied with the single end output signal Vout of the double/single signal converter Dbl_Sing_Conv, an amplifying transistor Qn5 having an input electrode connected to the other end of the coupling capacitor C1 and having an output electrode supplied with an operating voltage Vdd_ext via a load Op5, and a bias element R1 connected between the output electrode and input electrode of the amplifying transistor Qn5. The double/single signal converter Dbl_Sing_Conv includes a constant current source CS, N channel MOS transistors Qn1, Qn2, Qn3 and Qn4, and P channel MOS transistors Qp1, Qp2, QP3 and Qp4 in one example illustrated in FIG. 10. A current of the constant current source CS flows through either one of the differential-connected N channel MOS transistors Qn1 and Qn2 in response to the double end signals Vin and /Vin, so that the single end output signal Vout is driven to a high level by the current mirror Qp2 and Qp4, and the signal end output signal Vout is driven to a low level by the current mirror Qp1, Qp3, Qn3 and Qn4. The current of the constant current source CS is maintained as a constant current even depending upon variations in the external power supply voltage Vdd_ext. Thus, both the rate of change of the single end output signal Vout to the high level and the rate of change thereof to the low level are also maintained stably.

In the self-bias type voltage amplifier Self_Bias_Volt_Amp, the amplifying transistor Qn5 is constituted of an N channel MOS transistor. Although the load may be a passive load based on a resistance, it is constituted of an active load based on the P channel MOS transistor Qp5 opposite in polarity to the Qn5 to enlarge voltage amplifying gain.

In FIG. 10, the voltage amplifier supplied with the single end output signal Vout of the double/single signal converter Dbl_Sing_Conv through the coupling capacitor C1 is configured in the circuit form of the self-bias type voltage amplifier Self_Bias_Volt_Amp. Thus, even though a variation in the level of the external power supply voltage Vdd_ext takes place, a bias voltage for self-biasing based on the bias element R1 connected between the output electrode of the amplifying transistor Qn5 and the input electrode thereof changes following the variation in the level of the external power supply voltage Vdd_ext. When, for example, the level of the external power supply voltage Vdd_ext increases, the rate of change of the output VOUT from the external power supply voltage Vdd_ext to the high level via the load Qp5 increases. Since, at this time, the self bias voltage of the amplifying transistor Qn5 also increases, the rate of change in low level of the output VOUT from the output VOUT to a ground potential via the Qn5 increases. Thus, even though the variation in the level of the external power supply voltage Vdd_ext occurs, the duty ratio between high and low level periods of the level-converted output signal voltage VOUT obtained from the output of the self-bias type voltage amplifier Self_Bias_Volt_Amp becomes approximately constant. As a result, even if the variation in the level of the external power supply voltage Vdd_ext takes place, it is possible to reduce the amount of leakage of harmonic components of the oscillation output signal of the reference frequency oscillator DCXO, which is contained in the level-converted output signal voltage VOUT from the self-bias type voltage amplifier Self_Bias_Volt_Amp.

Incidentally, the double/single signal converter Dbl_Sing_Conv of the level converter Lev_Conv shown in FIG. 10 corresponds to the reference frequency oscillator DCXO that outputs the antiphase double end signals. If the reference frequency oscillator DCXO outputs a single end signal, then the double/single signal converter Dbl_Sing_Conv is unnecessary, and the single end signal corresponding to the output of the reference frequency oscillator DCXO can be supplied directly to one end of the coupling capacitor C1 of the self-bias type voltage amplifier Self_Bias_Volt_Amp shown in FIG. 10.

Figure 11:
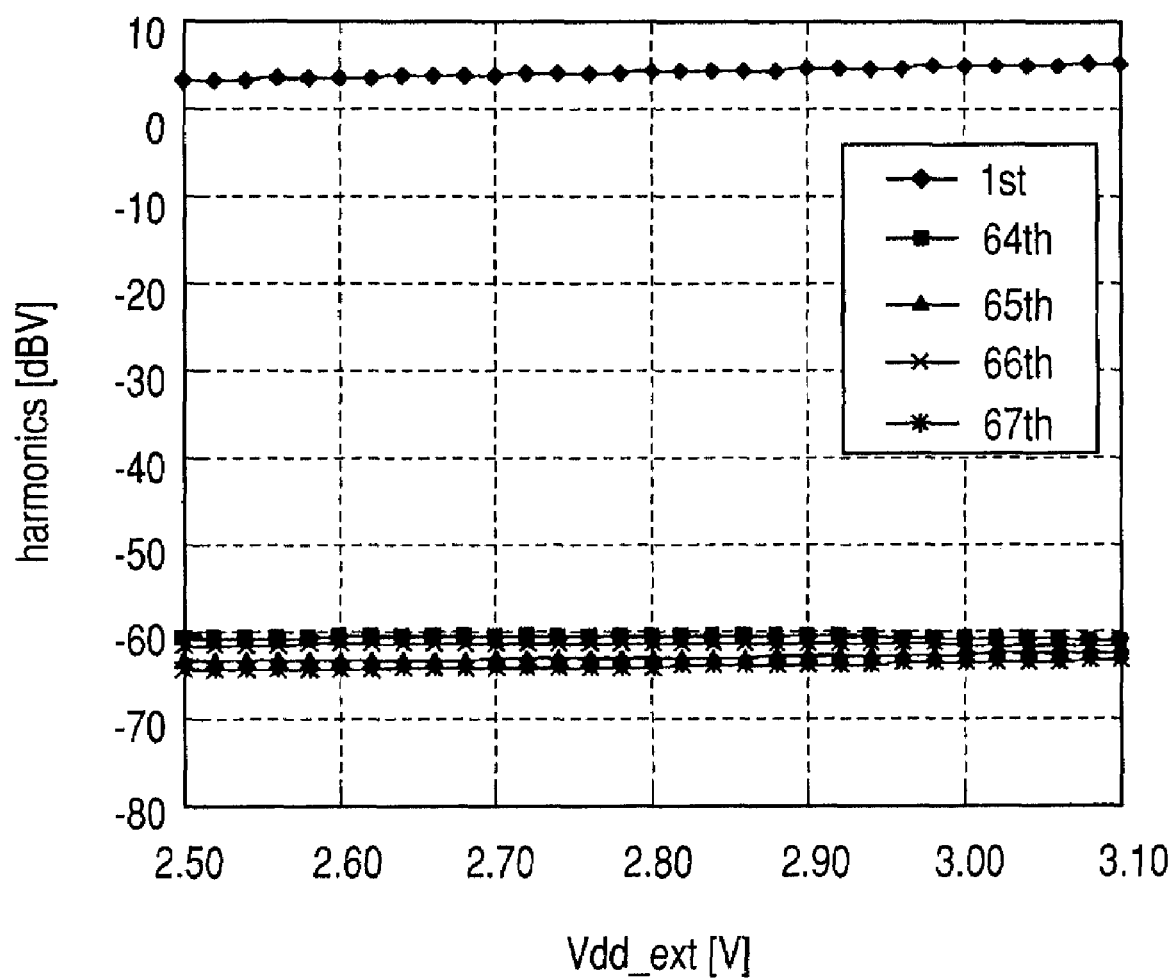
FIG. 11 is a result of simulation indicating that the levels of various harmonics generated from the level converter shown in FIG. 10 are little varied according to variations in external power supply voltage.

FIG. 11 is a result of simulation indicating that the levels of various harmonics generated from the level converter Lev_Conv shown in FIG. 10 is little varied according to variations in the external power supply voltage Vdd_ext. In FIG. 11, the horizontal axis indicates the level of the external power supply voltage Vdd_ext, and the vertical axis indicates the levels of the various harmonics. 1st indicates the level of a fundamental component of 26 MHz of a reference oscillation frequency from the reference frequency oscillator DCXO, 64th indicates the level of a 64-times harmonic, 65th indicates the level of a 65-times harmonic, 66th indicates a 66-times harmonic, and 67th indicates a 67-times harmonic, respectively. Even-numbered harmonics of the 64-times harmonic and the 66-times harmonic and odd-numbered harmonics of the 65-times harmonic and the 67-time harmonic are respectively brought to an approximately constant low level regardless of the variations in the external power supply voltage Vdd_ext.

Figure 12:
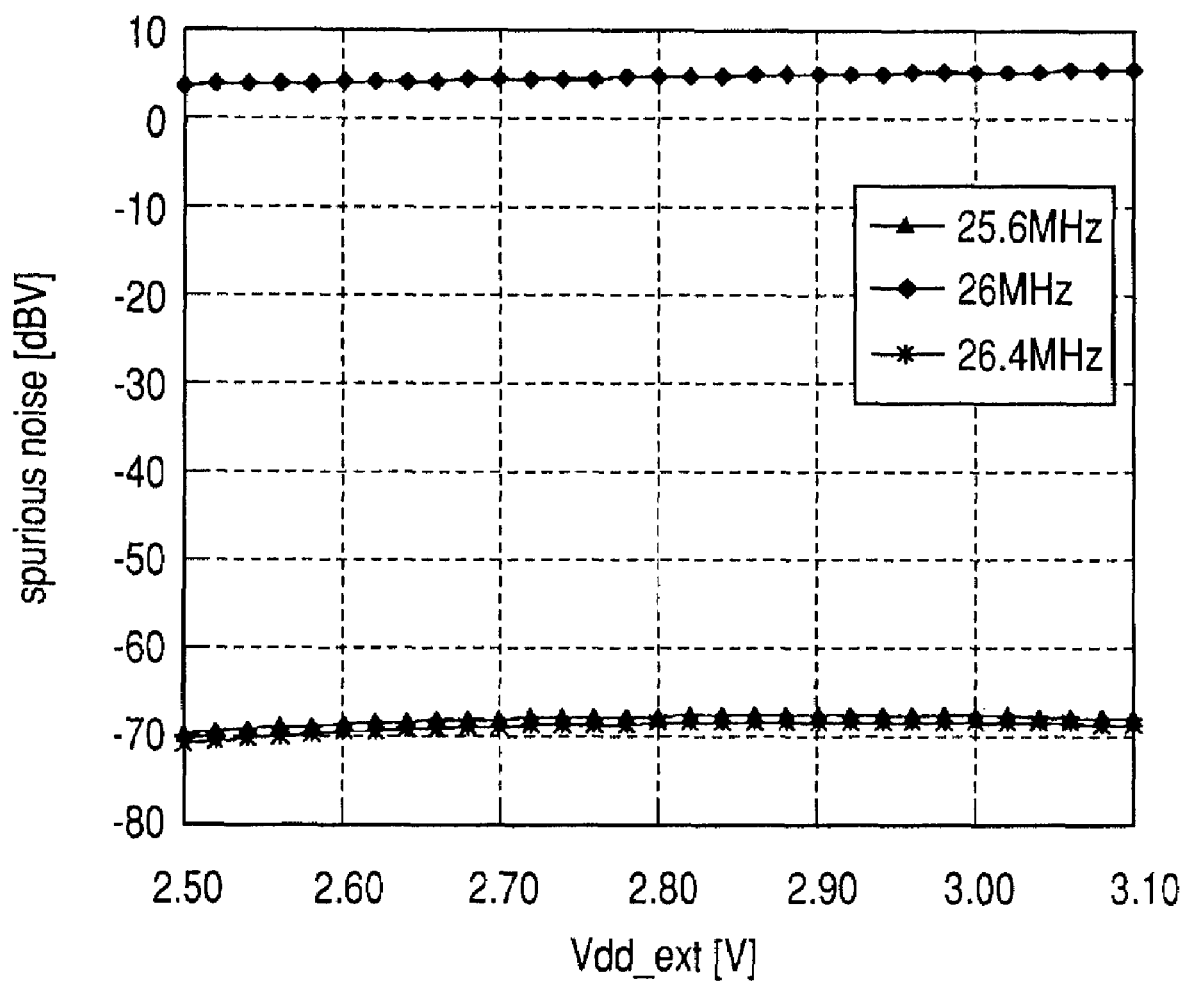
FIG. 12 is a result of simulation showing two spurious signals of 25.6 MHz and 26.4 MHz formed by the level converter where the level converter shown in FIG. 10 is used.

FIG. 12 is a result of simulation showing two spurious signals (unwanted interference signals) of 25.6 MHz and 26.4 MHz formed by the level converter Lev_Conv where the level converter Lev_Conv shown in FIG. 10 is used. In FIG. 12, the horizontal axis indicates the level of the external power supply voltage Vdd_ext, the vertical axis indicates the level of a signal, and 26 MHz indicates a signal level of a reference oscillation frequency fREF of 26 MHz generated from the reference frequency oscillator DCXO, respectively. Both of the two spurious signals (unwanted interference signals) of 25.6 MHz and 26.4 MHz become an approximately constant low level regardless of variations in the external power supply voltage Vdd_ext.

<<More Specific Embodiment of the Present Invention>>

Figure 13:
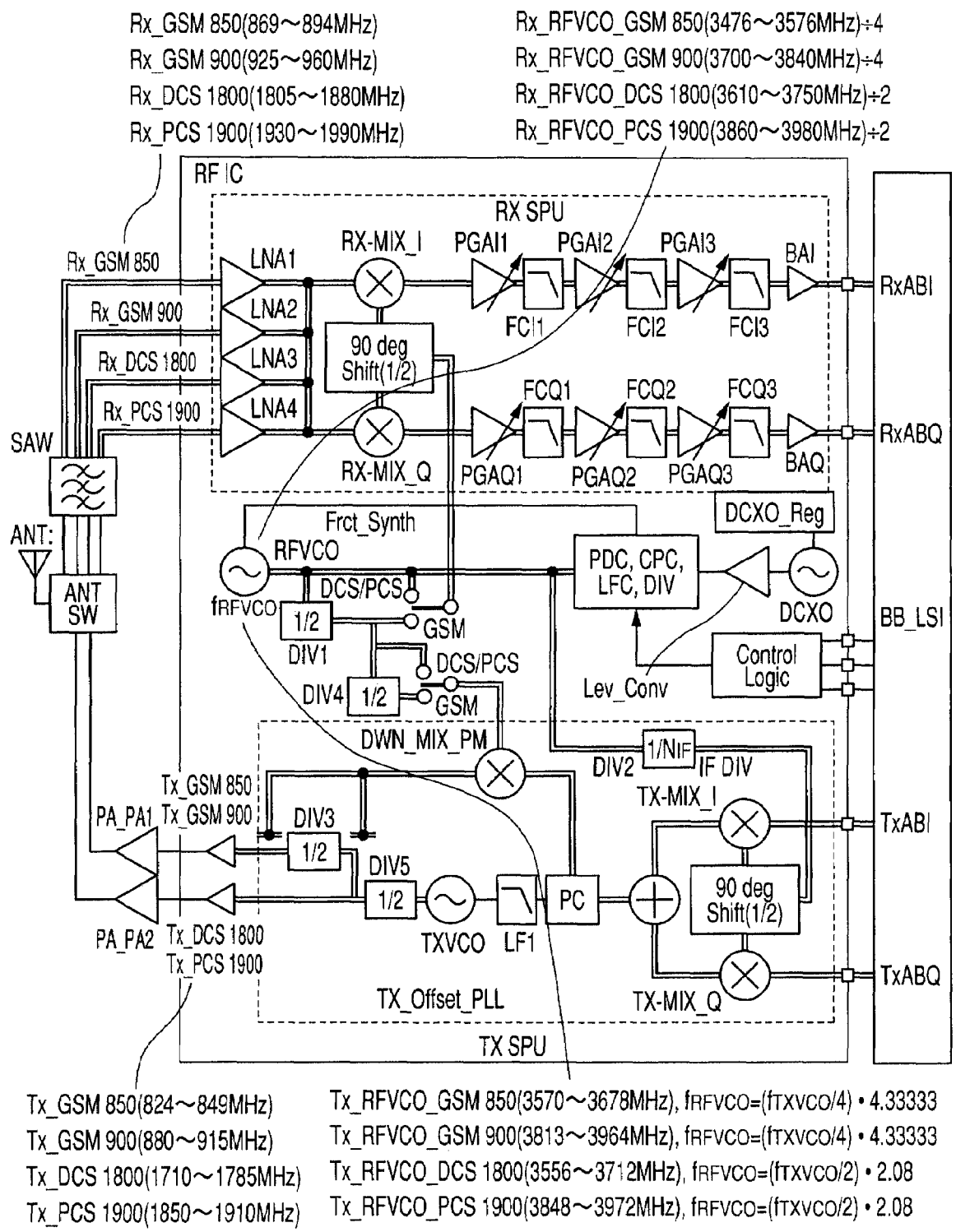
FIG. 13 is a diagram showing a configuration of a semiconductor integrated circuit device for communication, according to a more specific embodiment of the present invention.

FIG. 13 is a diagram showing a configuration of a semiconductor integrated circuit device RF IC for communication, according to a more specific embodiment of the present invention. The RF IC shown in FIG. 13 is configured so as to adapt to four bands corresponding to a quad band of GSM850 MHz, GSM900 MHz, DCS1800 MHz and PCS1900 MHz. Incidentally, DCS is an abbreviation of Digital Cellular System, and PCS is an abbreviation of Personal Communication System. Incidentally, in FIG. 13, Frct_Synth indicates the fractional PLL circuit described using FIG. 1 and FIG. 4, or an RF carrier synchronous subunit constituted of a fractional synthesizer. Incidentally, a level converter Lev_Conv in the fractional PLL circuit or the fractional synthesizer is constituted of the circuit shown in FIG. 10.

Incidentally, the RF IC corresponding to the individual bands of the quad band comprises the fractional synthesizer Frct_Synth, an RF receive signal/analog signal processing subunit RX SPU, and an RF transmit signal/analog signal processing subunit TX SPU. An RF receive signal received by an antenna ANT of a cellular phone terminal is supplied to the RF receive signal/analog signal processing subunit RX SPU via an antenna switch ANTSW and a surface acoustic wave filter SAW. The RF receive signal/analog signal processing subunit RX SPU demodulates the input RF receive signal to produce receive baseband signals RxABI and RxABQ and supplies them to a baseband LSI (BB_LSI). The RF transmit signal/analog signal processing subunit TX SPU is supplied with transmit baseband signals TxABI and TxABQ from the baseband LSI (BB_LSI). The RF transmit signal/analog signal processing subunit TX SPU modulates the input transmit baseband signals to form RF transmit signals and supplies the same to the antenna ANT of the cellular phone terminal through RF power amplifiers RF_PA1 and RD_PA2 and the antenna switch ANTSW.

The operation of reception of the RF receive signal/analog signal processing subunit RX SPU will first be explained. An RF receive signal received by the antenna of the cellular phone terminal is supplied to four low noise amplifiers via the antenna switch ANTSW and the surface acoustic wave filter SAW. A frequency band for an RF receive signal Rx_GSM850 in a band of GSM850 MHz ranges from 869 MHz to 894 MHz and is amplified by the first low noise amplifier LNA1. A frequency band for an RF receive signal Rx_GSM900 in a band of GSM900 MHz ranges from 925 MHz to 960 MHz and is amplified by the second low noise amplifier LNA2. A frequency band for an RF receive signal Rx_DCS1800 in a band of DCS1800 MHz ranges from 1805 MHz to 1880 MHz and is amplified by the third low noise amplifier LNA3. A frequency band for an RF receive signal Rx_PCS1900 in a band of PCS1900 MHz ranges from 1930 MHz to 1990 MHz and is amplified by the fourth low noise amplifier LNA4. The RF amplified reception output signals of the four low noise amplifiers LNA1 through LAN4 are supplied to one input terminals of two mixing circuits RX-MIX_I and RX-MIX_Q that constitute receiving mixers. Two RF carrier signals each having a 90° phase, which are formed by a 90° phase shifter 90degShift (½), are supplied to the other input terminals of the two mixing circuits RX-MIX_I and RX-MIX_Q. In a reception mode of GSM850 MHz or GSM900 MHz, an output of an RF voltage-controlled oscillator RFVCO is supplied to the 90° phase shifter 90degShift (½) via a ½ divider DIV having a division ratio 2. In a reception mode of DCS1800 MHz or PCS1900 MHz, an output of the RF voltage-controlled oscillator RFVCO is directly supplied to the 90° phase shifter 90degShift (½). A receive baseband signal RxABI and a receive baseband signal RxABQ are respectively generated from the output of the mixing circuit RX-MIX_I and the output of the mixing circuit RX-MIX_Q. The receive baseband signal RxABI and the receive baseband signal RxABQ are respectively supplied to the baseband LSI (BB_LSI) via programmable gain amplifiers PGAI1, PGAI2 and PGAI3, filter circuits FCI1, FCI2 and FCI3 and a buffer amplifier BAI, and programmable gain amplifiers PGAQ1, PGAQ2 and PGAQ3, filter circuits FCQ1, FCQ2 and FCQ3 and a buffer amplifier BAQ.

In order to adapt to the operation of receiving 869 MHz through 894 MHz lying in the frequency band for the RF receive signal Rx_GSM805 in the band of GSM850 MHz, an oscillation frequency fRFVCO of the RF voltage-controlled oscillator RFVCO is set to 3476 MHz through 3576 MHz. The oscillation frequency fRFVCO of the RF voltage-controlled oscillator RFVCO is ¼-divided by the divider DIV1 (½) set to the division ratio 2 and the 90° phase shifter 90degShift (½). Then, the RF division frequency signal ¼-divided into 869 MHz through 894 MHz is supplied to each of the two mixing circuits RX-MIX_I and RX-MIX_Q that constitute the receiving mixers. Thus, analog baseband receive signals RxABI and RxABQ based on the reception of the RF receive signal Rx_GSM805 in the band of GSM850 MHz are formed from the outputs of the two mixing circuits RX-MIX_I and RX-MIX_Q. In order to adapt to the operation of receiving 925 MHz through 960 MHz lying in the frequency band for the RF receive signal Rx_GSM900 in the band of GSM900 MHz, an oscillation frequency fRFVCO of the RF voltage-controlled oscillator RFVCO is set to 3700 MHz through 3840 MHz. The oscillation frequency fRFVCO of the RF voltage-controlled oscillator RFVCO is ¼-divided by the divider DIV1 (½) set to the division ratio 2 and the 90° phase shifter 90degShift (½). Then, the RF division frequency signal ¼-divided into 925 MHz through 960 MHz is supplied to each of the two mixing circuits RX-MIX_I and RX-MIX_Q that constitute the receiving mixers. Thus, analog baseband receive signals RxABI and RxABQ based on the reception of the RF receive signal Rx_GSM900 in the band of GSM900 MHz are formed from the outputs of the two mixing circuits RX-MIX_I and RX-MIX_Q. In order to adapt to the operation of receiving 1805 MHz through 1880 MHz lying in the frequency band for the RF receive signal Rx_DCS1800 in the band of DCS1800 MHz, an oscillation frequency fRFVCO of the RF voltage-controlled oscillator RFVCO is set to 3610 MHz through 3760 MHz. The oscillation frequency fRFVCO of the RF voltage-controlled oscillator RFVCO is ½-divided by the 90° phase shifter 90degShift (½). Then, the RF division frequency signal ½-divided into 1805 MHz through 1880 MHz is supplied to each of the two mixing circuits RX-MIX_I and RX-MIX_Q that constitute the receiving mixers. Thus, analog baseband receive signals RxABI and RxABQ based on the reception of the RF receive signal Rx_DCS1800 in the band of DCS1800 MHz are formed from the outputs of the two mixing circuits RX-MIX_I and RX-MIX_Q. In order to adapt to the operation of receiving 1930 MHz through 1990 MHz lying in the frequency band for the RF receive signal Rx_PCS1900 in the band of PCS1900 MHz, an oscillation frequency fRFVCO of the RF voltage-controlled oscillator RFVCO is set to 3860 MHz through 3980 MHz. The oscillation frequency fRFVCO of the RF voltage-controlled oscillator RFVCO is ½-divided by the 90° phase shifter 90degShift (½). Then, the RF division frequency signal ½-divided into 1930 MHz through 1990 MHz is supplied to each of the two mixing circuits RX-MIX_I and RX-MIX_Q that constitute the receiving mixers. Thus, analog baseband receive signals RxABI and RxABQ based on the reception of the RF receive signal Rx_PCS1900 in the band of PCS1900 MHz are formed from the outputs of the two mixing circuits RX-MIX_I and RX-MIX_Q.

The operation of transmission of the RF transmit signal/analog signal processing subunit TX SPU will next be explained. An RF oscillation output signal corresponding to the output of the RF voltage-controlled oscillator RFVCO of the fractional synthesizer Frct_Synth is supplied to an intermediate frequency divider DIV2 (1/NIF) set to a predetermined division ratio, whereby a double intermediate frequency signal is formed from the output of the intermediate frequency divider DIV2 (1/NIF). The double intermediate frequency signal is supplied to the input of a 90° phase shifter 90degShift from which two intermediate frequency signals of 68.624 MHz different 90° from each other in phase are formed. Transmitting mixers TX-MIX_I and TX-MIX_Q are supplied with baseband transmit signals TxABI and TxABQ sent from the baseband LSI (BB_LSI) and the two intermediate frequency signals of 68.624 MHz different 90° in phase, whereby a vector-combined intermediate frequency transmit signal of 68.624 MHz is formed at the output of an adder connected to the outputs of the transmitting mixers TX-MIX_I and TX-MIX_Q. The intermediate frequency transmit signal of 68.624 MHz is supplied to one input terminal of a phase comparator PC. An output of the phase comparator PC is supplied to an RF transmission voltage-controlled oscillator TXVCO via a low-pass filter LPF1, so that its oscillation frequency is controlled to an approximately 3431.2 MHz. A frequency band for an RF transmit signal Tx_GSM850 in a band of GSM850 MHz ranges from 824 MHz through 849 MHz. An oscillation output signal ranging from 3296 MHz through 3396 MHz of the RF transmission voltage-controlled oscillator TXVCO is supplied to the input of the first RF power amplifier RF_PA1 via two dividers DIV5 (½) and DIV3 (½) each set to a division ratio 2. A frequency band for an RF transmit signal Tx_GSM900 in a band of GSM900 MHz ranges from 880 MHz through 915 MHz. An oscillation output signal ranging from 3520 MHz through 3660 MHz of the RF transmission voltage-controlled oscillator TXVCO is supplied to the input of the first RF power amplifier RF_PA1 via the two dividers DIV5 (½) and DIV3 (½) each set to the division ratio 2. A frequency band for an RF transmit signal Tx_DCS1800 in a band of DCS1800 MHz ranges from 1710 MHz through 1785 MHz. An oscillation output signal ranging from 3420 MHz through 3570 MHz of the RF transmission voltage-controlled oscillator TXVCO is supplied to the input of the second RF power amplifier RF_PA2 via the one divider DIV5 (½) set to the division ratio 2. A frequency band for an RF transmit signal Tx_PCS1900 in a band of PCS1900 MHz ranges from 1850 MHz through 1910 MHz. An oscillation output signal ranging from 3700 MHz through 3820 MHz of the RF transmission voltage-controlled oscillator TXVCO is supplied to the input of the second RF power amplifier RF_PA2 via the one divider DIV5 (½) set to the division ratio 2.

In order to adapt to the operation of transmission for 824 MHz through 848 MHz of the frequency band of the RF transmit signal Tx_GSM850 in the band of GSM850 MHz and for 880 MHz through 915 MHz of the frequency band of the RF transmit signal Tx_GSM900 in the band of GSM900 MHz, an oscillation frequency fRFVCO of the RF voltage-controlled oscillator RFVCO is supplied to one input terminal of a phase control feedback frequency downmixer DWN_MIX_PM of a transmission system offset PLL circuit TX_Offset_PLL via the two dividers DIV1 (½) and DIV4 (½) set to the division ratio 2. A division ratio NIF of the intermediate frequency divider DIV2 (1/NIF) connected to the 90° phase shifter 90degShift (½) connected to the two mixing circuits TX-MIX_I and TX-MIX_Q constituting the transmitting mixers of the transmission system offset PLL circuit TX_Offset_PLL is set to 26. Thus, an oscillation output signal of an oscillation frequency fTXVCO of the RF transmission voltage-controlled oscillator TXVCO is supplied to one input terminal of the phase control feedback frequency downmixer DWN_MIX_PM via the two dividers DIV5 (½) and DIV3 (½) each set to the division ratio 2. The ¼-divided signal of the oscillation frequency fRFVCO of the RF voltage-controlled oscillator RFVCO is supplied to the other input terminal of the phase control feedback frequency downmixer DWN_MIX_PM via the two dividers DIV1 (½) and DIV4 (½). The phase control feedback frequency downmixer DWN_MIX_PM performs mixing of the corresponding ¼-divided signal of the oscillation frequency fRFVCO and the corresponding ¼-divided signal of the oscillation output signal having the oscillation frequency fTXVCO from the RF transmission voltage-controlled oscillator TXVCO. Thus, a feedback signal having a frequency corresponding to a difference of (¼)×fRFVCO−(¼)×fTXVCO is formed from the output of the phase control feedback frequency downmixer DWN_MIX_PM and supplied to the other input terminal of the phase comparator PC of the transmission system offset PLL circuit TX_Offset_PLL. One input terminal of the phase comparator PC is supplied with the intermediate frequency transmit signal fIF vector-combined at the output of the adder connected to the outputs of the transmitting mixers TX-MIX_I and TX-MIX_Q. The intermediate frequency transmit signal fIF becomes fRFVCO/52 by 26 corresponding to the division ratio NIF of the intermediate frequency divider DIV2 (1/NIF) and the ½-division function of the 90° phase shifter 90degShift. Since the reference frequency at the one input terminal of the phase comparator PC and the negative feedback frequency at the other input terminal of the phase comparator PC coincide with each other by negative feedback control of the transmission system offset PLL circuit TX_Offset_PLL, the following relationship is established:

$$fRFVCO/52 = (1/4) \times fRFVCO - (1/4) \times fTXVCO \; (1/4) \times fTXVCO =$$

$$(1/4) \times fRFVCO - fRFVCO/52 = (13-1)/52) \times$$

$$fRFVCO = (12/52) \times fRFVCO$$

$$\therefore \; fRFVCO = 4.33333 \times (1/4) \times fTXVCO$$

Thus, in order to adapt to the operation of transmission for 824 MHz through 848 MHz of the frequency band of the RF transmit signal Tx_GSM850 in the band of GSM850 MHz and for 880 MHz through 915 MHz of the frequency band of the RF transmit signal Tx_GSM900 in the band of GSM900 MHz, the oscillation frequency fRFVCO of the RF voltage-controlled oscillator RFVCO may be set to 4.33333 times the ¼-divided signal ((¼)×fTXVCO) of the oscillation frequency fTXVCO of the RF transmission voltage-controlled oscillator TXVCO. Accordingly, the oscillation frequency fRFVCO of the RF voltage-controlled oscillator RFVCO may be set to 3570.6639 MHz through 3678.9971 MHz in association with 824 MHz through 849 MHz for the frequency band of the RF transmit signal Tx_GSM850 in the band of GSM850 MHz. Further, the oscillation frequency fRFVCO of the RF voltage-controlled oscillator RFVCO may be set to 3813.3304 MHz through 3974.997 MHz in association with 880 MHz through 915 MHz for the frequency band of the RF transmit signal Tx_GSM900 lying in the band of GSM900 MHz.

In order to adapt to the operation of transmission for 1710 MHz through 1785 MHz of the frequency band of the RF transmit signal Tx_DCS1800 in the band of DCS1800 MHz and for 1850 MHz through 1910 MHz of the frequency band of the RF transmit signal Tx_PCS1900 in the band of PCS1900 MHz, an oscillation frequency fRFVCO of the RF voltage-controlled oscillator RFVCO is supplied to one input terminal of the phase control feedback frequency downmixer DWN_MIX_PM of the transmission system offset PLL circuit TX_Offset_PLL via the one divider DIV1 (½) set to the division ratio 2. The division ratio NIF of the intermediate frequency divider DIV2 (1/NIF) connected to the 90° phase shifter 90degShift (½) connected to the two mixing circuits TX-MIX_I and TX-MIX_Q constituting the transmitting mixers of the transmission system offset PLL circuit TX_Offset_PLL is set 26. Thus, an oscillation output signal of an oscillation frequency fTXVCO of the RF transmission voltage-controlled oscillator TXVCO is supplied to one input terminal of the phase control feedback frequency downmixer DWN_MIX_PM via the one divider DIV5 (½) set to the division ratio 2. The ½-divided signal of the oscillation frequency fRFVCO of the RF voltage-controlled oscillator RFVCO is supplied to the other input terminal of the phase control feedback frequency downmixer DWN_MIX_PM via the one divider DIV1 (½). The phase control feedback frequency downmixer DWN_MIX_PM performs mixing of the corresponding ½-divided signal of the oscillation frequency fRFVCO and the corresponding ½-divided signal of the oscillation output signal having the oscillation frequency fTXVCO from the RF transmission voltage-controlled oscillator TXVCO. Thus, a feedback signal having a frequency corresponding to a difference of (½)×fRFVCO−(½)×fTXVCO is formed from the output of the phase control feedback frequency downmixer DWN_MIX_PM and supplied to the other input terminal of the phase comparator PC of the transmission system offset PLL circuit TX_Offset_PLL. One input terminal of the phase comparator PC is supplied with an intermediate frequency transmit signal fIF vector-combined at the output of the adder connected to the outputs of the transmitting mixers TX-MIX_I and TX-MIX_Q. The intermediate frequency transmit signal fIF becomes fRFVCO/52 by 26 corresponding to the division ratio NIF of the intermediate frequency divider DIV2 (1/NIF) and the ½-division function of the 90° phase shifter 90degShift. Since the reference frequency at the one input terminal of the phase comparator PC and the negative feedback frequency at the other input terminal of the phase comparator PC coincide with each other by negative feedback control of the transmission system offset PLL circuit TX_Offset_PLL, the following relationship is established:

$$fRFVCO/52=(½)\times fRFVCO-(½)\times fTXVCO\ (½)\times fTX\text{-}VCO=(½)\times fRFVCO-fRFVCO/52=((26-1)/52)\times fRFVCO=(25/52)\times fRFVCO\ \therefore fRFVCO=2.08\times(½)\times fTXVCO$$

Thus, in order to adapt to the operation of transmission for 1710 MHz through 1785 MHz of the frequency band of the RF transmit signal Tx_DCS1800 in the band of DCS1800 MHz and for 1850 MHz through 1910 MHz of the frequency band of the RF transmit signal Tx_PCS1900 in the band of PCS1900 MHz, the oscillation frequency fRFVCO of the RF voltage-controlled oscillator RFVCO may be set to 2.08 times the ½-divided signal ((½)×fTXVCO) of the oscillation frequency fTXVCO of the RF transmission voltage-controlled oscillator TXVCO. Accordingly, the oscillation frequency fRFVCO of the RF voltage-controlled oscillator RFVCO may be set to 3556.8 MHz through 3712.8 MHz in association with 1710 MHz through 1785 MHz for the frequency band of the RF transmit signal Tx_DCS1800 in the band of DCS1800 MHz. Further, the oscillation frequency fRFVCO of the RF voltage-controlled oscillator RFVCO may be set to 3848 MHz through 3972.8 MHz in association with 1850 MHz through 1910 MHz for the frequency band of the RF transmit signal Tx_PCS1900 lying in the band of PCS1900 MHz.

Upon the operation of transmission of the RF transmit signal Tx_DCS1800 lying in the band of DCS1800 MHz even in the embodiment shown in FIG. 13, an RF transmit signal of 1715.6 MHz is generated from the output of the one divider DIV5 (½) set to the division ratio 2, which is supplied with an oscillation output signal having an oscillation frequency fTX-VCO of 3431.2 MHz from the RF transmission voltage-controlled oscillator TXVCO. Thus, in a manner similar to the embodiment shown in FIG. 4, high frequency signal components of the oscillation frequency fTXVCO of 1715.6 MHz from the output of the divider DIV5 (½) based on the output of the RF transmission voltage-controlled oscillator TXVCO lead into the level converter Lev_Conv. As a result, the level converter Lev_Conv performs mixing of a harmonic (1690 MHz) equal to 65 times the reference oscillation frequency 26 MHz from the reference frequency oscillator DCXO, which is generated at the level converter Lev_Conv and the high frequency signal components of the leaked oscillation frequency fTXVCO of 1715.6 MHz, and mixing of a harmonic (1742 MHz) equal to 67 times the reference oscillation frequency 26 MHz from the reference frequency oscillator DCXO, which is generated at the level converter Lev_Conv and the high frequency signal components of the leaked oscillation frequency fTXVCO of 1715.6 MHz. As a result of such mixing, there is a possibility that in a manner similar to the embodiment of FIG. 4, two spurious signals (unwanted interference signals) each having a difference frequency will be formed by the level converter Lev_Conv in proximity to the reference oscillation frequency fREF of 26 MHz generated from the reference frequency oscillator DCXO. Even in the embodiment shown in FIG. 13, the level of each harmonic of the reference frequency from the reference frequency oscillator DCXO is suppressed by using, in the fractional synthesizer Frct_Synth, the level converter Lev_Conv that suppresses the harmonic components of the reference oscillation frequency from the reference frequency oscillator DCXO shown in FIG. 10.

Figure 14:
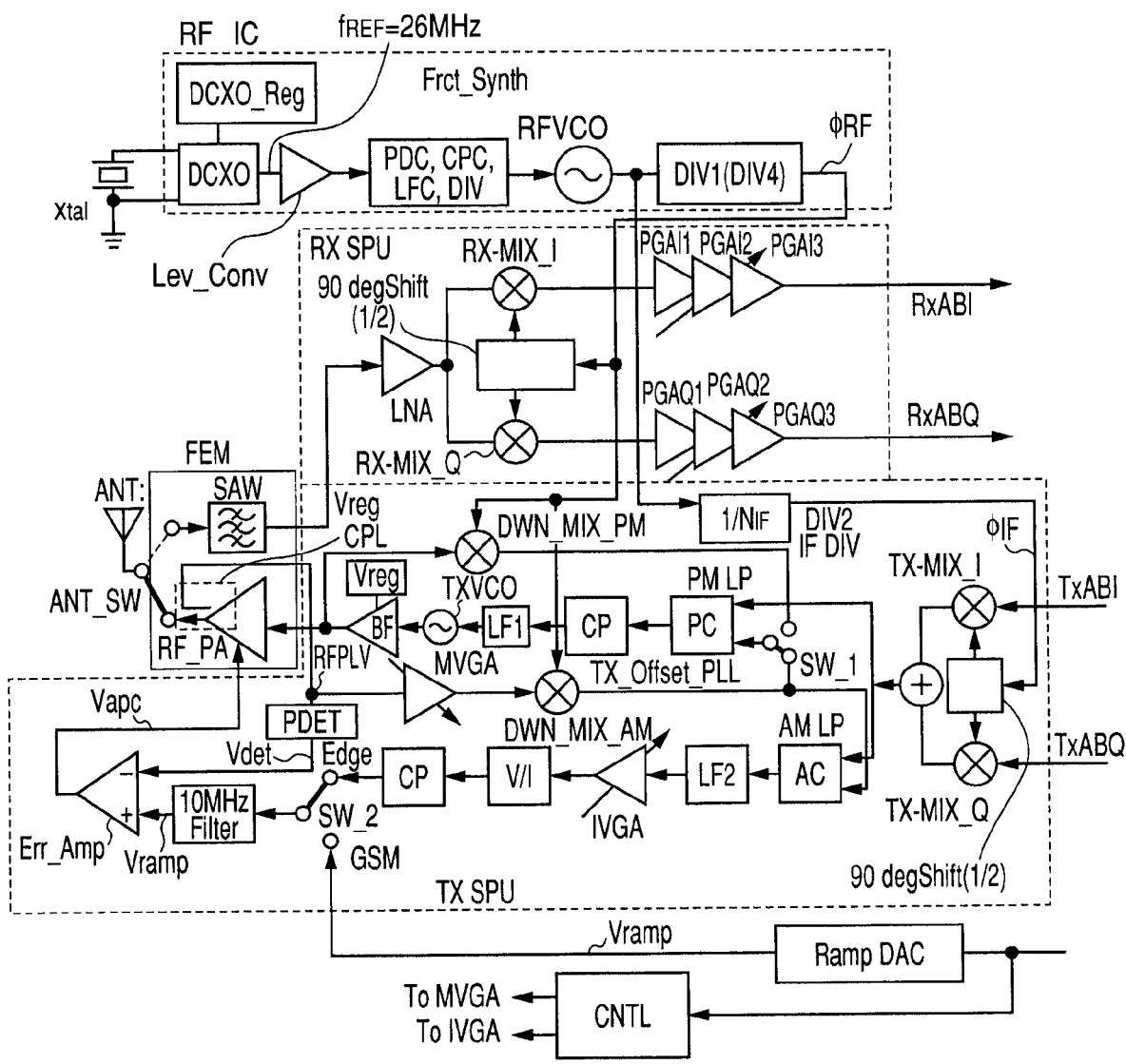
FIG. 14 is a diagram illustrating a configuration of a semiconductor integrated circuit device for communication, according to a further specific embodiment of the present invention.

FIG. 14 is a diagram showing a configuration of a semiconductor integrated circuit device RF IC for communication, according to a further specific embodiment of the present invention.

The RF IC adopts a polar loop type transmission system for adapting to an EDGE system in which phase modulation and amplitude modulation are used for communications between a base station and each communication terminal.

One semiconductor chip for the RF IC includes three sub-units Frct_Synth, RX SPU and TX SPU. An antenna ANT for transmission/reception of a cellular phone terminal and a front end module FEM are shown in FIG. 14 even other than the RF IC. The front end module FEM includes an antenna switch ANT_SW, a transmitting RF power amplifier RF_PA and a power coupler CPL for detecting transmission power sent from the transmitting RF power amplifier RF_PA.

In FIG. 14, the subunit Frct_Synth is an RF carrier synchronous subunit constituted of the fractional PLL circuit or fractional synthesizer described using FIG. 1 and FIG. 4. Incidentally, a level converter Lev_Conv in the fractional PLL circuit or the fractional synthesizer is constituted of the circuit shown in FIG. 10. In the RF carrier synchronous subunit Frct_Synth, the fractional frequency synthesizer to which a system reference clock signal generated from a system reference clock oscillator DCXO in which an oscillation frequency fREF is stably maintained by an external crystal oscillator Xtal of the integrated circuit RF IC, maintains even an RF oscillation frequency fRFVCO of an RF oscillator RFVCO stably. When the RF output of the RF oscillator RFVCO is supplied to a divider DIV1 (DIV4) (½ or ¼), an RF signal ΦRF is obtained from the output of the divider DIV1 (DIV4) (½ or ¼). The RF signal ΦRF is supplied to the RF receive signal/analog signal processing subunit RX SPU and RF transmit signal/analog signal processing subunit TX SPU lying inside the RF analog signal processing integrated circuit RF IC for communication. That is, the RF transmit signal/analog signal processing subunit 302TX SPU is configured in a polar loop system for adapting to the EDGE system.

In a time slot set to a reception state, the antenna switch ANT_SW of the front end module FEM is connected to the upper side. Thus, an RF receive signal received by the antenna ANT is supplied to the input of a low noise amplifier LNA of the RF receive signal/analog signal processing subunit RX SPU through a receiving filter SAW constituted of, for example, a surface acoustic wave device. An RF amplified output signal of the low noise amplifier LNA is supplied to one inputs of two mixing circuits RX-MIX_I and RX-MIX_Q that constitute receiving mixers. Two RF carrier signals each having a 90° phase, which are formed by a 90° phase shifter 90degShift (½) based on the RF signal ΦRF sent from the divider DIV1 (DIV4) (½ or ¼), are supplied to the other inputs of the two mixing circuits RX-MIX_I and RX-MIX_Q. As a result, the mixing circuits RX-MIX_I and RX-MIX_Q corresponding to the receiving mixers execute direct down frequency conversion from an RF receive signal frequency to a baseband signal frequency to obtain reception analog baseband signals RxABI and RxABQ from their outputs. The reception analog baseband signals RxABI and RxABQ are amplified by programmable gain amplifiers PGAI1, PGAI2 and PGA3 and PGAQ1, PGAQ2 and PGAQ3 whose gains are adjusted by the reception time-slot setting, followed by being converted to digital signals by an A/D converter lying within the chip of the RF IC. The digital receive signals are supplied to an unillustrated baseband processing LSI.

In a time slot set to a transmission state, digital transmit baseband signals are supplied from the unillustrated baseband signal processing LSI to the RF IC. As a result, analog baseband transmit signals TxABI and TxABQ are supplied from the output of an illustrated D/A converter lying inside the RF IC to two mixing circuits TX-MIX_I and TX-MIX_Q corresponding to transmitting mixers of the RF transmit signal/analog signal processing subunit TX SPU. An RF oscillation frequency fRFVCO of the RF oscillator RFVCO is divided by an intermediate frequency divider DIV2 (1/NIF) to obtain a signal ΦIF having an intermediate frequency fIF. Two IF transmit carrier signals each having a 90° phase formed by a 90° phase shifter 90degShift based on the IF signal ΦIF are supplied to the other inputs of the two mixing circuits TX-MIX_I and TX-MIX_Q. As a result, the mixing circuits TX-MIX_I and TX-MIX_Q corresponding to the transmitting mixers execute frequency up conversion from the frequencies of the analog baseband transmit signals to IF transmit signals to obtain one vector-combined IF transmit modulation signal from an adder. The IF transmit modulation signal outputted from the adder is supplied to one input of a phase comparator PC that constitutes a PM loop circuit PM LP for transmission of phase-modulated components, of the RF transmit signal/analog signal processing subunit TX SPU. In the PM loop circuit PM LP, the output of the phase comparator PC is transmitted to a control input of a transmitting oscillator TXVCO via a charge pump CP and a low-pass filter LF1.

A buffer amplifier BF whose input is connected to the output of the transmitting oscillator TXVCO is supplied with an operating voltage sent from a voltage regulator Vreg. The output of the transmitting voltage-controlled oscillator TXVCO is supplied to the input of a PM loop frequency downmixer DWN_MIX_PM supplied with the RF signal ΦRF from the divider DIV1 (DIV4) (½ or ¼), so that a first IF transmit feedback signal is obtained from the output of the PM loop frequency downmixer DWN_MIX_PM. As phase modulation information at the time that the transmission time slot is under the GSM system, the first IF transmit feedback signal is supplied to the other input of the phase comparator PC that constitutes the PM loop circuit PM LP via a switch SW_1. As a result, the transmit signal corresponding to the output of the transmitting RF power amplifier RF_PA contains the accurate phase modulation information for the GSM system. Transmission power information (amplifying gain of transmitting RF power amplifier RF_PA) at the time that the transmission time slot is based on the GSM system, is designated by a ramp output voltage Vramp of a ramp signal D/A converter Ramp DAC lying inside the RF IC. The ramp output voltage Vramp is supplied to a 10-MHz filter (10 MHzFilter) via a switch SW2. The ramp output voltage Vramp outputted from this filter and a transmission power detection signal Vdet from both the power coupler CPL for detecting the transmission power of the transmitting RF power amplifier RF_PA and a power detection circuit PDET are supplied to an error amplifier Err_Amp. The amplifying gain of the transmitting RF power amplifier RF_PA is set in proportion to the distance between a base station and a portable communication terminal by power supply voltage control or bias voltage control based on an automatic power control voltage Vapc outputted from the error amplifier Err_Amp. Incidentally, a digital ramp input signal supplied from a baseband signal processing unit like the baseband LSI to the ramp signal D/A converter Ramp DAC is a transmission power level designation signal indicative of the level of transmission power and is used for controlling high the transmission power level in proportion to the distance between the base station and the communication terminal. An analog ramp output voltage Vramp is generated from the output of the ramp signal D/A converter Ramp DAC.

On the other hand, when the transmission time slot is based on the EDGE system, the IF transmit modulation signal sent from the adder contains not only the phase modulation information but also amplitude modulation information. Thus, the IF transmit modulation signal sent from the adder is supplied not only to one input of the phase comparator PC constituting the PM loop circuit PM LP but also to one input of an amplitude comparator AC that constitutes an AM loop circuit AM LP. At this time, the output of the transmitting oscillator TXVCO is not supplied to the other input of the phase comparator PC via the PM loop frequency downmixer DWN- _MIX_PM. Rather than it, information (RF transmission power level RFPLV) related to the transmission power of the transmitting RF power amplifier RF_PA is supplied to the other input of the phase comparator PC via the power coupler CPL, programmable gain circuit MVGA and AM loop frequency downmixer DWN_MIX_AM. The information (RF transmission power level RFPLV) related to the transmission power of the transmitting RF power amplifier RF_PA is supplied even to the other input of the amplitude comparator AC constituting the AM loop circuit AM LP via the power coupler CPL, programmable gain circuit MVGA and AM loop frequency downmixer DWN_MIX_AM. In the AM loop circuit AM LP, the output of the amplitude comparator AC is supplied to the 10 MHz filter (10 MHzFilter) via a low-pass filter LF2, a programmable gain circuit IVGA, a voltage/current converter V/I, a charge pump CP and the switch SW2. As a result, the transmission power signal corresponding to the output of the transmitting RF power amplifier RF_PA for amplifying the RF oscillation output signal of the transmitting oscillator TXVCO first contains the accurate phase modulation information based on the EDGE system by means of the PM loop circuit PM LP. Further, the transmission power signal corresponding to the output of the transmitting RF power amplifier RF_PA contains the accurate amplitude modulation information based on the EDGE system by means of the AMP loop circuit AM LP.

Incidentally, as the power coupler CPL for detecting the transmission power of the transmitting RF power amplifier RF_PA, there can be adopted a coupler which electromagnetically or capacitively detects the transmission power of the RF power amplifier RF_PA. As the power coupler CPL, a current sense type coupler other than it can also be adopted. The current sense type coupler allows a small detection DC/AC operating current proportional to a DC/AC operating current of a final-stage power amplifying element of an RF power amplifier RF_PA to flow through a detection amplifying element.

In the RF IC shown in FIG. 14, the control circuit CNTL generates two control signals of 8 bits in response to a 10-bit digital ramp signal in such a manner that the gains of the two programmable gain circuits MVGA and IVGA of the AM loop circuit AM LP that responds to the ramp voltage Vramp of the ramp signal D/A converter Ramp DAC are in a reverse direction. That is, when the gain of the programmable gain circuit MVGA decreases in response to the ramp voltage Vramp, the programmable gain circuit IVGA increases in gain. Hence, the sum of the gains of the two programmable gain circuits MVGA and IVGA becomes approximately constant. This result can lighten that a phase allowance for the open loop frequency characteristic of the AM loop circuit AM LP becomes remarkably small in response to the ramp voltage Vramp.

Even in the embodiment shown in FIG. 14, the level of each harmonic of the reference frequency from the reference frequency oscillator DCXO is suppressed by using, in the fractional synthesizer Frct_Synth, the level converter Lev_Conv that suppresses the harmonic components of the reference oscillation frequency from the reference frequency oscillator DCXO shown in FIG. 10.

Figure 15:
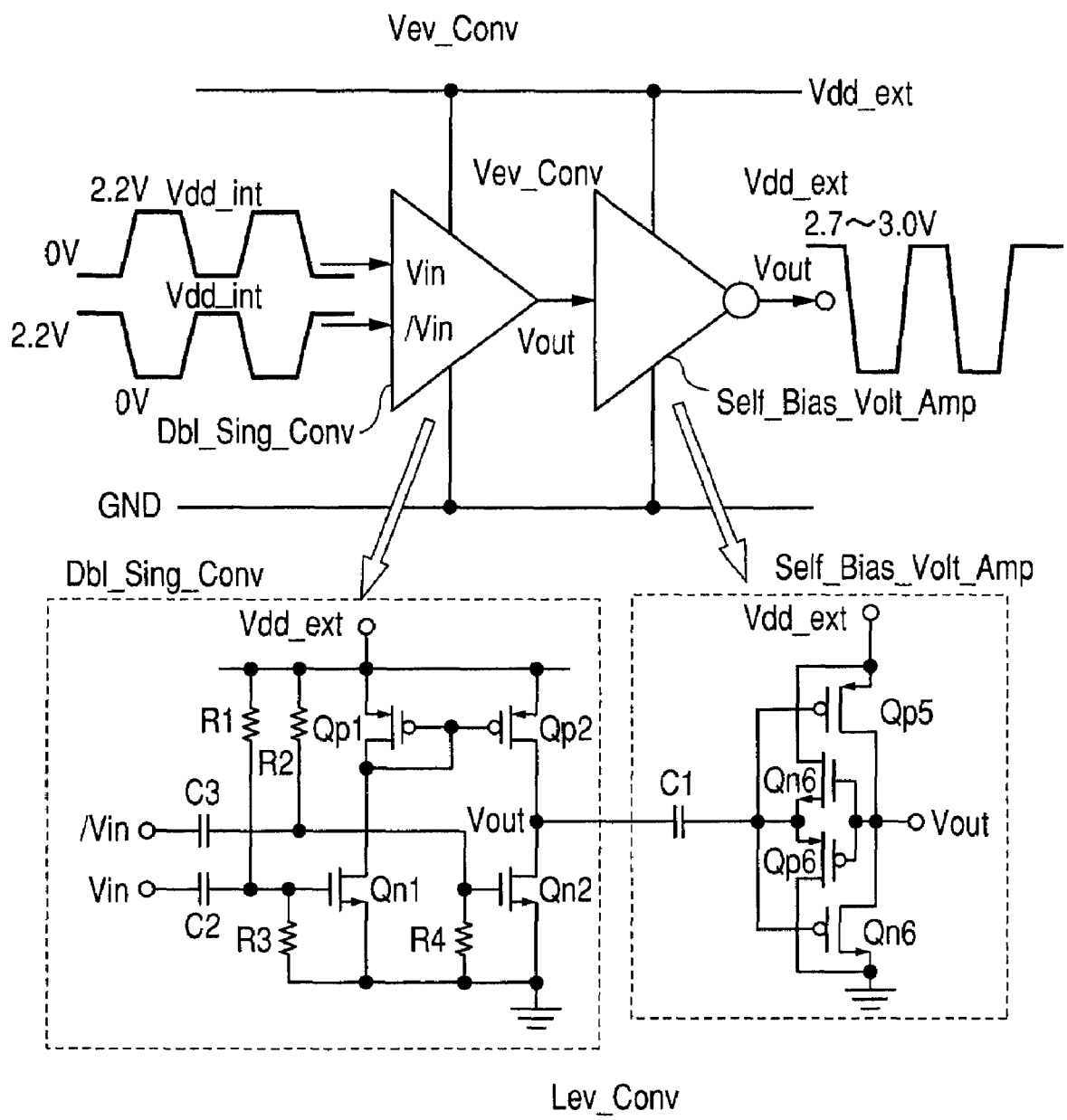
FIG. 15 shows a circuit configuration of a level converter according to another embodiment of the present invention, which is used in FIGS. 4, 13 and 14 respectively.

FIG. 15 shows a circuit configuration of a level converter Lev_Conv according to another embodiment of the present invention, which is used in FIGS. 4, 13 and 14 respectively. The level converter Lev_Conv shown in FIG. 15 includes a double/single signal converter Dbl_Sing_Conv which outputs a single end output signal Vout by being supplied with double end signals Vin and /Vin of a reference frequency signal from a reference frequency oscillator DCXO, and a voltage amplifier which amplifies the single end output signal Vout of the double/single signal converter Dbl_Sing_Conv. The voltage amplifier is configured in a circuit form of a self-bias type voltage amplifier Self_Bias_Volt_Amp including a coupling capacitor C1 having one end supplied with the single end output signal Vout of the double/single signal converter Dbl_Sing_Conv, complementary amplifying transistors Qn5 and Qp5 whose input electrodes are connected to the other end of the coupling capacitor C1, and bias elements Qn6 and Qp6 respectively connected between the output and input electrodes of the amplifying transistors Qn5 and Qp5. In one example illustrated in FIG. 15, the double/single signal converter Dbl_Sing_Conv includes N channel MOS transistors Qn1 and Qn2 whose gates are supplied with the double end signals Vin and /Vin of the reference frequency signal of the reference frequency oscillator DCXO through capacitors C2 and C3, P channel MOS transistors Qp1 and Qp2 each configured as a current mirror, which are connected to the drain of the N channel MOS transistors Qn1 and Qn2, bias resistors R1 and R3 for the Qn1, and bias resistors R2 and R4 for the Qn2. A current flows through either one of the N channel MOS transistors Qn1 and Qn2 in response to the double end signals Vin and /Vin. When the double end signals Vin and /Vin are respectively high and low levels, the current flows through the Qn1, so that the single end output signal Vout is driven to a high level by the current mirror Qp1 and Qp2. When the double end signals Vin and /Vin are respectively low and high levels, the current flows through the Qn2, so that the signal end output signal Vout is driven to a low level. Since the current flowing through the Qn1 of the double/single signal converter Dbl_Sing_Conv and the current flowing through the Qn2 are equal to each other even depending upon variations in external power supply voltage Vdd_ext, both the rate of change of the single end output signal Vout to the high level and the rate of change thereof to the low level are also maintained on a stable basis. Even though a variation in the level of the external power supply voltage Vdd_ext takes place, a bias voltage for self-biasing based on the bias elements Qn6 and Qp6 connected between the output and input electrodes of the amplifying transistor Qn5 and Qp5 of the self-bias type voltage amplifier Self_Bias_Volt_Amp changes following the variation in the level of the external power supply voltage Vdd_ext. Thus, even though the variation in the level of the external power supply voltage Vdd_ext occurs, the duty ratio between high and low level periods of a level-converted output signal voltage VOUT obtained from the output of the self-bias type voltage amplifier Self_Bias_Volt_Amp becomes approximately constant. As a result, even if the variation in the level of the external power supply voltage Vdd_ext takes place, it is possible to reduce a variation in the level of each harmonic component of an oscillation output signal of the reference frequency oscillator DCXO, which is contained in the level-converted output signal voltage VOUT from the output of the self-bias type voltage amplifier Self_Bias_Volt_Amp.

Figure 16:
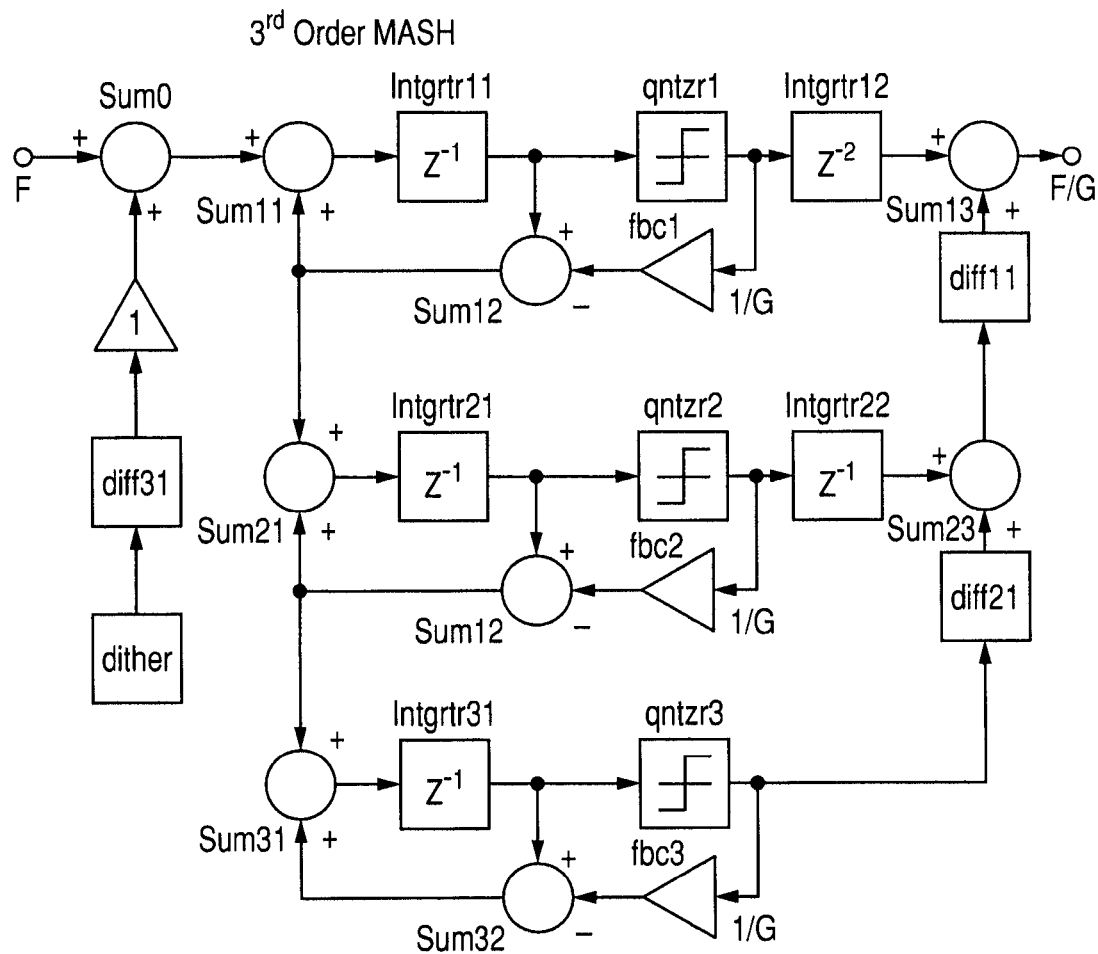
FIG. 16 is a diagram showing a MASH type ΣΔ modulator used in each of the fractional synthesizers shown in FIGS. 1, 4, 13, 14 and 18.

FIG. 16 is a diagram showing a MASH type ΣΔ modulator ΣΔMod configured by MASH (Multistage noise Shaping Technique) used in each of the fractional synthesizers shown in FIGS. 1, 4, 13, 14 and 18. The MASH type ΣΔ modulator is equivalent to one wherein primary or first-order ΣΔ modulators are connected in multistage form, and can obtain nth ΣΔ modulation noise/shaving characteristics.

As shown in the same figure, a first-stage ΣΔ modulator includes an adder Sum11, a delay circuit used as an integrator Intgrtr11, a 1-bit output quantizer qntzr1, a feedback circuit fbc1 having gain 1/G and an adder Sum12 in a manner similar to the ΣΔ modulator ΣΔMod shown in FIG. 2. An output of the quantizer qntzr1 is transmitted to an adder Sum13 for an output F/G via an integrator Intgrtr12. An output of the adder Sum12 of the first-stage ΣΔ modulator is transmitted to a second-stage ΣΔ modulator. In a manner similar to the first-stage ΣΔ modulator, the second-stage ΣΔ modulator includes an adder Sum21, a delay circuit used as an integrator Intgrtr21, a 1-bit output quantizer qntzr2, a feedback circuit fbc2 having gain 1/G, an adder Sum22, an integrator Intgrtr22 and an adder Sum23. Further, the second-stage ΣΔ modulator includes a digital differentiator dif11 connected between the output of the adder Sum23 and the input of the adder Sum13. An output of the adder Sum22 of the second-stage ΣΔ modulator is transmitted to a third-stage ΣΔ modulator. The third stage ΣΔ modulator includes an adder Sum31, a delay circuit used as an integrator Intgrtr31, a 1-bit output quantizer qntzr3, a feedback circuit fbc3 having gain 1/G and an adder Sum32. An output of the quantizer qntzr3 is transmitted to the adder Sum23 via a digital differentiator dif21.

The ΣΔ modulator ΣΔMod shown in FIG. 16 is a third-order or tertiary ΣΔ modulator, which is the same as the high-order ΣΔ modulator ΣΔMod reported by the above non-patent document 3 in principle and can improve noise shaving characteristics. The high-order ΣΔ modulator ΣΔMod is not limited to the third-order ΣΔ modulator. Third-order to fifth-order ΣΔ modulators can be used.

Incidentally, as shown in FIG. 16, another adder Sum0 is connected between an input terminal supplied with fractional value information F and the input of the adder Sum11 of the first-stage ΣΔ modulator. The fractional value information F is supplied to one input terminal of the adder Sum0 and pseudo random noise outputted from a dither dither is transmitted to the other input terminal of the adder Sum0 via a digital differentiator diff31 and an amplifier (1) set to a gain 1.

Figure 17:
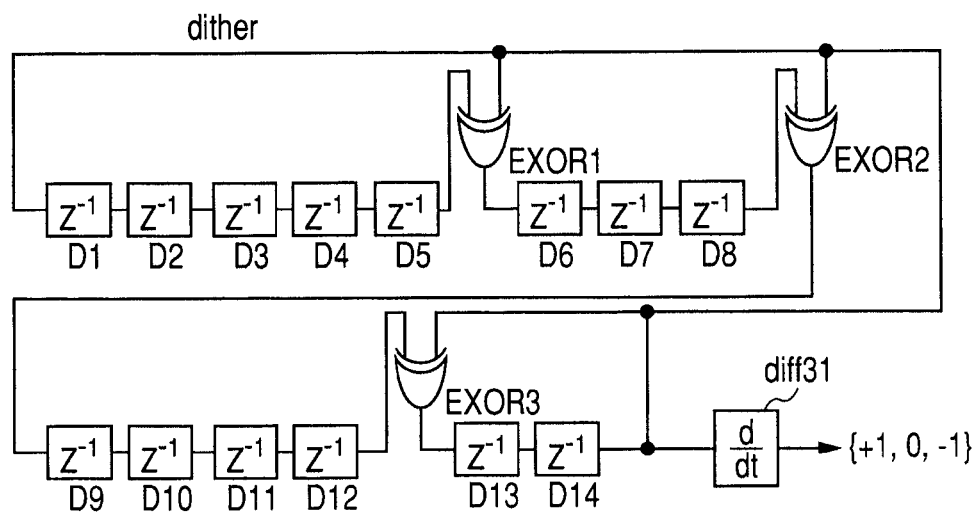
FIG. 17 is a diagram illustrating a circuit configuration of a dither shown in FIG. 16.

FIG. 17 is a diagram showing a circuit configuration of the dither dither shown in FIG. 16. As shown in the same figure, the dither dither comprises delay circuits D1 through D5 of five stages, an exclusive OR circuit EXOR1, delay circuits D6 through D8 of three stages, an exclusive OR circuit EXOR2, delay circuits D9 through D12 of four stages, an exclusive OR circuit EXOR3 and delay circuits D13 and D14 of two stages. When an initial value is inputted to the first-stage delay circuit D1, an output of the final-stage delay circuit D14 is fed back to its corresponding input of the first-stage delay circuit D1. An output of the dither dither is pseudo random noise with a 1-bit stream of "0" and "1", having combinations of 215-1 types. As a result, the output of the digital differentiator diff31 connected to the output of the dither dither becomes any of +1, 0 and −1. However, +1 is not outputted continuously and −1 is not outputted continuously either. If the dither dither and the digital differentiator diff31 are omitted, then a spurious signal due to a periodic change in division ratio of a circuit for the high-order ΣΔ modulator ΣΔMod dependent on the fractional value information F is generated in the high-order ΣΔ modulator ΣΔMod (e.g., third-order ΣΔ modulator) shown in FIG. 16. In order to reduce the spurious signal, a dither width from the dither dither connected to the other input terminal of the adder Sum0 shown in FIG. 16 is set to a suitable value. As a result, noise (fractional noise) due to the periodic change in division ratio of the circuit for the high-order ΣΔ modulator ΣΔMod is disturbed by the pseudo random noise, and the spurious signal to be frequency-converted upon dither is further frequency-converted into high frequencies. Consequently, the level of each spurious signal in a 400-KHz frequency band strict under the standard of the transmission modulation spectrum defined under the GMSK (Gaussian minimum Shift Keying) standard.

Figure 18:
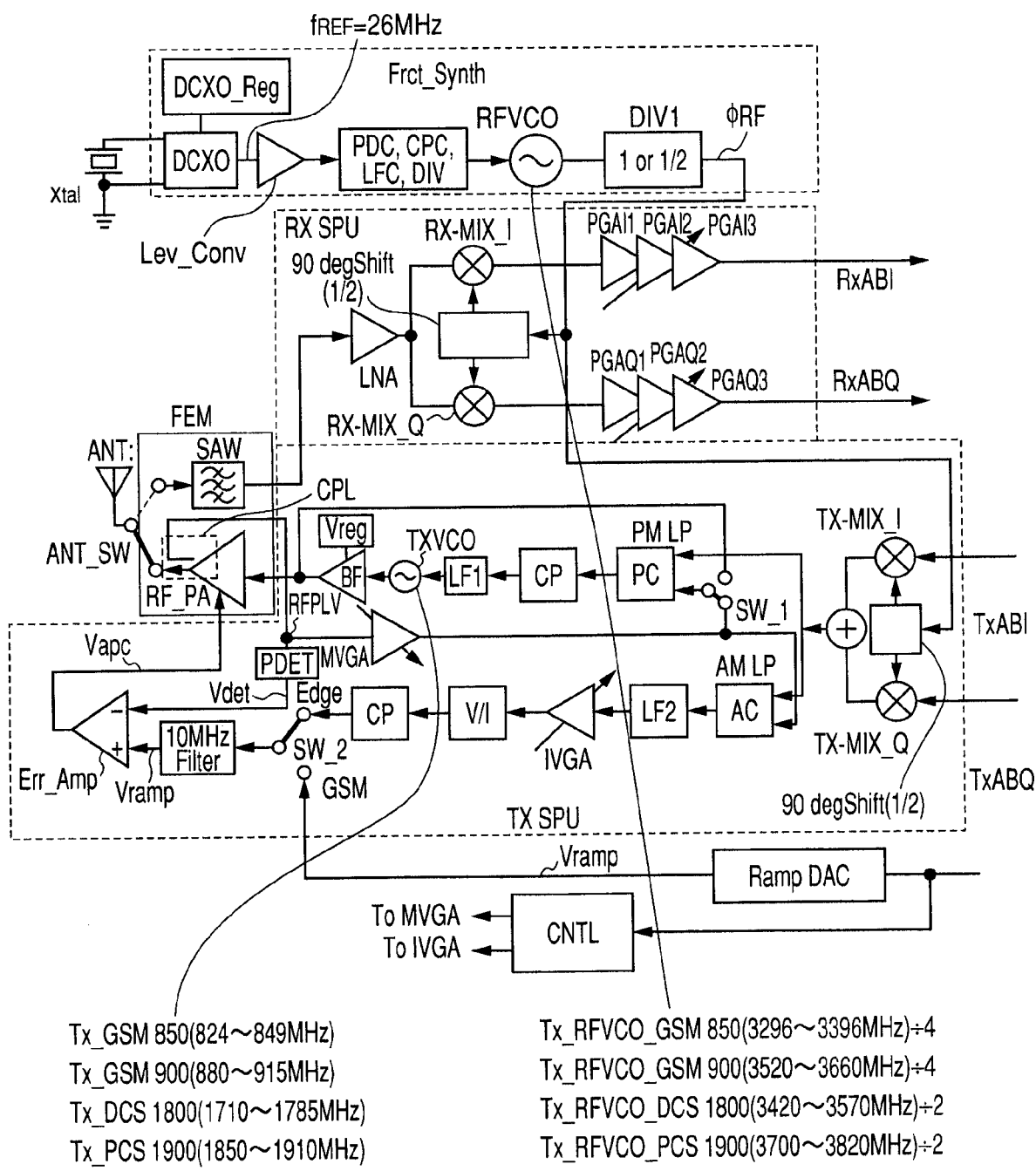
FIG. 18 is a diagram showing a configuration of a semiconductor integrated circuit device for communication configured in a polar loop system for adapting to an EDGE system by another embodiment of the present invention.

FIG. 18 is a diagram showing a configuration of a semiconductor integrated circuit device RF IC for communication configured in a polar loop system for adapting to the EDGE system by another embodiment of the present invention. In an RF transmit signal/analog signal processing subunit TX SPU of the RF IC shown in FIG. 18, the transmission system offset PLL circuit TX_Offset_PLL is not adopted and a direct up-conversion system is adopted. That is, an output of a divider DIV1 (½) supplied with an oscillation frequency fRFVCO of an RF voltage-controlled oscillator RFVCO or the oscillation frequency fRFVCO of the RF voltage-controlled oscillator RFVCO is supplied to a 90° phase shifter 90degShift (½) connected to transmitting mixers TX-MIX_I and TX-MIX_Q supplied with baseband transmit signals TxABI and TxABQ from a baseband LSI, as an RF signal ΦRF. When a frequency band of GSM850 MHz or GSM900 MHz is transmitted, the output of the divider DIV1 (½) supplied with the oscillation frequency fRFVCO of the RF voltage-controlled oscillator RFVCO is supplied to the 90° phase shifter 90degShift (½) connected to the transmitting mixers TX-MIX_I and TX-MIX_Q as the RF signal ΦRF. When a frequency band of DCS1800 MHz or PCS1900 MHz is transmitted, the oscillation frequency fRFVCO of the RF voltage-controlled oscillator RFVCO is supplied to the 90° phase shifter 90degShift (½) connected to the transmitting mixers TX-MIX_I and TX-MIX_Q as the RF signal ΦRF. As a result, the transmitting mixers TX-MIX_I and TX-MIX_Q execute frequency conversion from a baseband frequency for each of the baseband transmit signals TxAB1 and TxABQ to an RF oscillation frequency fTXVCO of an RF transmission voltage-controlled oscillator TXVCO in accordance with the direct up-conversion system. An RF transmit modulation signal from an adder connected to the transmitting mixers TX-MIX_I and TX-MIX_Q is supplied not only to one input of a phase comparator PC constituting a PM loop circuit PM LP for transmitting phase-modulated components in the RF transmit signal/analog signal processing subunit TX SPU but also to one input of an amplitude comparator AC that constitutes an AM loop circuit AM LP. In the RF transmit signal/analog signal processing subunit TX SPU of the RF IC shown in FIG. 18, the phase control feedback frequency downmixer DWN_MIX_PM and AM loop frequency downmixer DWN_MIX_AM shown in FIG. 14 are deleted.

A buffer amplifier BF whose input is connected to the output of the transmitting oscillator TXVCO is supplied with an operating voltage outputted from a voltage regulator Vreg. When a transmission time slot is based on the GSM system, phase modulation information at the output of the transmission voltage-controlled oscillator TXVCO is supplied to the other input of the phase comparator PC that constitutes the PM loop circuit PM LP, via a switch SW_1. As a result, a transmit signal corresponding to the output of a transmitting RF power amplifier RF_PA contains accurate phase modulation information based on the GSM system. Transmission power information (amplifying gain of transmitting RF power amplifier RF_PA) at the time that the transmission time slot is based on the GSM system, is designated by a ramp output voltage Vramp of a ramp signal D/A converter Ramp DAC lying inside the RF IC. The ramp output voltage Vramp is supplied to a 10-MHz filter (10 MHzFilter) via a switch SW2. The ramp output voltage Vramp outputted from this filter and a transmission power detection signal Vdet from both a power coupler CPL for detecting the transmission power of the transmitting RF power amplifier RF_PA and a power detection circuit PDET are supplied to an error amplifier Err_Amp. The amplifying gain of the transmitting RF power amplifier RF_PA is set in proportion to the distance between a base station and a portable communication terminal by power supply voltage control or bias voltage control based on an automatic power control voltage Vapc outputted from the error amplifier Err_Amp.

On the other hand, when the transmission time slot is based on the EDGE system, an IF transmit modulation signal sent from an adder contains not only the phase modulation information but also amplitude modulation information. Thus, the IF transmit modulation signal sent from the adder is supplied not only to one input of the phase comparator PC constituting the PM loop circuit PM LP but also to one input of the amplitude comparator AC that constitutes the AM loop circuit AM LP. At this time, information (RF transmission power level RFPLV) related to the transmission power of the transmitting RF power amplifier RF_PA is supplied to the other input of the phase comparator PC via the power coupler CPL and programmable gain circuit MVGA. The information (RF transmission power level RFPLV) related to the transmission power of the transmitting RF power amplifier RF_PA is supplied even to the other input of the amplitude comparator AC constituting the AM loop circuit AM LP via the power coupler CPL and programmable gain circuit MVGA. In the AM loop circuit AM LP, the output of the amplitude comparator AC is supplied to the 10 MHz filter (10 MHzFilter) via a low-pass filter LF2, a programmable gain circuit IVGA, a voltage/current converter V/I, a charge pump CP and the switch SW2. As a result, the transmission power signal corresponding to the output of the transmitting RF power amplifier RF_PA for amplifying the RF oscillation output signal of the transmitting oscillator TXVCO first contains the accurate phase modulation information based on the EDGE system by means of the PM loop circuit PM LP. Further, the transmission power signal corresponding to the output of the transmitting RF power amplifier RF_PA contains the accurate amplitude modulation information based on the EDGE system by means of the AMP loop circuit AM LP.

In the RF IC shown in FIG. 18, in order to adapt to the operation of transmission for 824 MHz through 848 MHz of a frequency band of an RF transmit signal Tx_GSM850 in the band of GSM850 MHz and for 880 MHz through 915 MHz of a frequency band of an RF transmit signal Tx_GSM900 in the band of GSM900 MHz, the oscillation frequency fRFVCO of the RF voltage-controlled oscillator RFVCO may be set to four times the oscillation frequency fTXVCO of the RF transmission voltage-controlled oscillator TXVCO. Accordingly, the oscillation frequency fRFVCO of the RF voltage-controlled oscillator RFVCO may be set to 3296 MHz through 3396 MHz in association with 824 MHz through 848 MHz for the frequency band of the RF transmit signal Tx_GSM850 in the band of GSM850 MHz. Further, the oscillation frequency fRFVCO of the RF voltage-controlled oscillator RFVCO may be set to 3520 MHz through 3660 MHz in association with 880 MHz through 915 MHz for the frequency band of the RF transmit signal Tx_GSM900 lying in the band of GSM900 MHz. The oscillation frequency fRFVCO of the RF voltage-controlled oscillator RFVCO, which is close to approximately 3.2 GHz through 3.7 GHz, is ¼-divided by a division ratio 2 of the divider DIV1 and a ½ dividing function of the 90° phase shifter 90degShift (½) connected to the transmitting mixers TX-MIX_I and TX-MIX_Q so that an RF transmit signal Tx_GSM850 in a GSM850 MHz band and an RF transmit signal Tx_GSM900 in a GSM900 MHz band, both of which range from approximately 0.8 GHz to 0.9 GHz are generated from the RF transmission voltage-controlled oscillator TXVCO. In order to adapt to the operation of transmission for 1710 MHz through 1785 MHz of a frequency band of an RF transmit signal Tx_DCS1800 in the band of DCS1800 MHz and for 1850 MHz through 1910 MHz of a frequency band of an RF transmit signal Tx_PCS1900 in the band of PCS1900 MHz, the oscillation frequency fRFVCO of the RF voltage-controlled oscillator RFVCO may be set to twice the oscillation frequency fTXVCO of the RF transmission voltage-controlled oscillator TXVCO. Accordingly, the oscillation frequency fRFVCO of the RF voltage-controlled oscillator RFVCO may be set to 3420 MHz through 3570 MHz in association with 1710 MHz through 1785 MHz for the frequency band of the RF transmit signal Tx_DCS1800 in the band of DCS1800 MHz. Further, the oscillation frequency fRFVCO of the RF voltage-controlled oscillator RFVCO may be set to 3700 MHz through 3820 MHz in association with 1850 MHz through 1910 MHz for the frequency band of the RF transmit signal Tx_PCS1900 lying in the band of PCS1900 MHz. The oscillation frequency fRFVCO of the RF voltage-controlled oscillator RFVCO, which is close to approximately 3.2 GHz through 3.7 GHz, is ½-divided by a division ratio 1 of the divider DIV1 and the ½ dividing function of the 90° phase shifter 90degShift (½) connected to the transmitting mixers TX-MIX_I and TX-MIX_Q so that an RF transmit signal Tx_DCS1800 in a DCS1800 MHz band, and an RF transmit signal Tx_PCS1900 in a PCS1900 MHz band, both of which range from approximately 1.6 GHz to 1.9 GHz are generated from the RF transmission voltage-controlled oscillator TXVCO.

Upon the operation of transmission of the RF transmit signal Tx_DCS1800 lying in the band of DCS1800 MHz even in the embodiment shown in FIG. 18, high frequency signal components of the oscillation frequency fTXVCO of 1715.6 MHz from the RF transmission voltage-controlled oscillator TXVCO lead into the level converter Lev_Conv in a manner similar to the embodiment shown in FIG. 4. As a result, the level converter Lev_Conv performs mixing of a harmonic (1690 MHz) equal to 65 times the reference oscillation frequency 26 MHz from the reference frequency oscillator DCXO, which is generated at the level converter Lev_Conv, and the high frequency signal components of the leaked oscillation frequency fTXVCO of 1715.6 MHz, and mixing of a harmonic (1742 MHz) equal to 67 times the reference oscillation frequency 26 MHz from the reference frequency oscillator DCXO, which is generated at the level converter Lev_Conv, and the high frequency signal components of the leaked oscillation frequency fTXVCO of 1715.6 MHz. As a result of such mixing, there is a possibility that in a manner similar to the embodiment of FIG. 4, two spurious signals (unwanted interference signals) each having a difference frequency will be formed by the level converter Lev_Conv in proximity to the reference oscillation frequency fREF of 26 MHz generated from the reference frequency oscillator DCXO. Even in the embodiment shown in FIG. 18, the level of each harmonic of the reference frequency from the reference frequency oscillator DCXO is suppressed by using, in the fractional synthesizer Frct_Synth, the level converter Lev_Conv that suppresses the harmonic components of the reference oscillation frequency from the reference frequency oscillator DCXO shown in FIG. 10 or 15.

While the invention made above by the present inventors has been described specifically on the basis of the preferred embodiments, the present invention is not limited to the embodiments referred to above. It is needless to say that various changes can be made thereto without the scope not departing from the gist thereof.

For example, in the level converter Lev_Conv shown in each of FIGS. 10 an 15, the N channel MOS transistors and the P channel MOS transistors can respectively be substituted with NPN bipolar transistors and PNP bipolar transistors.

What is claimed is:

1. A semiconductor integrated circuit device for communication, comprising:
   a PLL circuit which constitutes a frequency synthesizer including,
      a reference frequency oscillator which generates a reference frequency signal having a reference oscillation frequency;
      a phase comparator having one input terminal supplied with the reference frequency signal formed from the reference frequency oscillator;
      an RF voltage-controlled oscillator which responds to an output of the phase comparator; and
      a divider connected between an output terminal of the RF voltage-controlled oscillator and the other input terminal of the phase comparator;
   an RF transmission voltage-controlled oscillator which generates an RF transmit frequency signal used for an RF transmit signal for RF communication; and
   a level converter which converts an amplitude level of an oscillation output signal of the reference frequency signal of the reference frequency oscillator to an input amplitude level of the phase comparator in the PLL circuit,
   wherein an RF transmit frequency of the RF transmit frequency signal generated from the RF transmission voltage-controlled oscillator is set in response to an oscillation frequency of an RF oscillation output signal generated from the RF voltage-controlled oscillator in the PLL circuit,
   wherein the level converter includes a voltage amplifier which amplifies the reference frequency signal of the reference frequency oscillator, and
   wherein the voltage amplifier is configured in a circuit form of a self-bias type voltage amplifier including a coupling capacitor having one end supplied with the reference frequency signal of the reference frequency oscillator, an amplifying transistor having an input electrode connected to the other end of the coupling capacitor and having an output electrode supplied with an operating voltage via a load, and a bias element connected between the output electrode and input electrode of the amplifying transistor.

2. The semiconductor integrated circuit device for communication according to claim 1, wherein the amplifying transistor and the load are reverse conduction-type transistors.

3. The semiconductor integrated circuit device for communication according to claim 1, wherein the amplifying transistor and the load are respectively an N channel MOS transistor and a P channel MOS transistor.

4. The semiconductor integrated circuit device for communication according to claim 1, wherein the PLL circuit which constitutes the frequency synthesizer is a fractional PLL circuit in which a division ratio of the divider is periodically changed from a predetermined value to a change value for the predetermined value to allow an average division ratio to contain an integer and a fraction.

5. The semiconductor integrated circuit device for communication according to claim 4, wherein the fractional PLL circuit includes a $\Sigma\Delta$ modulator for calculating the fraction of the average division ratio.

6. The semiconductor integrated circuit device for communication according to claim 5, wherein the $\Sigma\Delta$ modulator is a MASH type in which a plurality of first-order $\Sigma\Delta$ modulators are configured in multistage form.

7. The semiconductor integrated circuit device for communication according to claim 6, wherein the $\Sigma\Delta$ modulator of the MASH type is supplied with pseudo random noise outputted from a dither circuit via a digital differentiator.

8. The semiconductor integrated circuit device for communication according to claim 1, wherein the PLL circuit that constitutes the frequency synthesizer includes an intermediate frequency divider which divides the RF oscillation output signal having the oscillation frequency generated from the RF voltage-controlled oscillator to produce intermediate frequency signals,
   wherein the semiconductor integrated circuit device includes transmitting mixers which form an intermediate frequency transmit signal from the intermediate frequency signals generated from the intermediate frequency divider and transmit baseband signals, a transmission system offset PLL circuit, and an RF divider which divides the RF oscillation output signal having the oscillation frequency generated from the RF voltage-controlled oscillator to generate a division RF frequency signal,
   wherein the transmission system offset PLL circuit includes a phase comparator having one input terminal supplied with the intermediate frequency transmit signal generated from the transmitting mixers, the RF transmission voltage-controlled oscillator which responds to an output of the phase comparator, and a phase control feedback frequency downmixer having one input terminal supplied with the RF transmit frequency signal having the RF transmit frequency generated from the RF transmission voltage-controlled oscillator and the other input terminal supplied with the division RF frequency signal generated from the RF divider, the phase control feedback frequency downmixer supplying an output signal to the other input terminal of the phase comparator, and
   wherein in such a manner that the levels of leakage spurious signals caused by mixing at the level converter, of harmonic signal components of the reference frequency signal generated upon level conversion of the level converter and high frequency signal components having leaked into the level converter in connection with the RF transmit frequency signal having the RF transmit frequency satisfy a GMSK standard at a frequency adjacent to the RF transmit frequency, the levels of the harmonic signal components generated upon the level conversion of the level converter are suppressed by the self-bias type voltage amplifier of the level converter.

9. The semiconductor integrated circuit device for communication according to claim 8, further comprising an RF receive signal/analog signal processing circuit,
   wherein the RF receive/analog signal processing circuit includes low noise amplifiers each of which amplifies an RF receive signal, and receiving mixers which generate receive baseband signals by being supplied with RF amplified reception output signals generated by the low noise amplifiers,
   wherein the PLL circuit that constitutes the frequency synthesizer includes a first divider which divides the RF oscillation output signal having the oscillation frequency generated from the RF voltage-controlled oscillator to form RF carrier signals supplied to the receiving mixers, and a second divider which divides an output signal of the first divider,
   wherein when the semiconductor integrated circuit device receives the RF receive signal in a frequency band of GSM850 MHz or a frequency band of GSM900 MHz, the division output signal generated from the first divider is transmitted to the receiving mixers as the RF carrier signals, whereby frequency-converted receive baseband signals are generated from the receiving mixers based on the RF receive signal in the frequency band of GSM850 MHz or the frequency band of GSM900 MHz, wherein when the semiconductor integrated circuit device receives the RF receive signal in a frequency band of DCS1800 MHz or a frequency band of PCS1900 MHz, the RF oscillation output signal having the oscillation frequency generated from the RF voltage-controlled oscillator is transmitted to the receiving mixers as the RF carrier signals, whereby frequency-converted receive baseband signals are generated from the RF receive signal in the frequency band of DCS1800 MHz or the frequency band of PCS1900 MHz, wherein when the semiconductor integrated circuit device forms the RF transmit frequency signal in the frequency band of GSM850 MHz or the frequency band of GSM900 MHz, the intermediate frequency transmit signal is formed by the transmitting mixers based on the intermediate frequency signals and transmit baseband signals, and each of the first divider and the second divider is operated as the RF divider, whereby a division output signal of the second divider is transmitted to the other input terminal of the phase control feedback frequency downmixer of the transmission system offset PLL circuit as the division RF frequency signal, and the intermediate frequency transmit signal is frequency-converted to the RF transmit frequency signal in the frequency band of GSM850 MHz or the frequency band of GSM900 MHz at the transmission system offset PLL circuit, and wherein when the semiconductor integrated circuit device forms the RF transmit frequency signal in the frequency band of DCS1800 MHz or the frequency band of PCS1900 MHz, the intermediate frequency transmit signal is formed by the transmitting mixers based on the intermediate frequency signals and transmit baseband signals, and the first divider is operated as the RF divider, whereby a division output signal of the first divider is transmitted to the other input terminal of the phase control feedback frequency downmixer of the transmission system offset PLL circuit as the division RF frequency signal, and the intermediate frequency transmit signal is frequency-converted to the RF transmit frequency signal in the frequency band of DCS1800 MHz or the frequency band of PCS1900 MHz at the transmission system offset PLL circuit.

10. The semiconductor integrated circuit device for communication according to claim 9, which is configured in a polar loop system for adapting to an EDGE system, and wherein the transmission system offset PLL circuit includes a phase loop for phase modulation of the polar loop system and an amplitude loop of the polar loop system, and the phase comparator, the RF transmission voltage-controlled oscillator and the phase control feedback frequency downmixer in the transmission system offset PLL circuit constitute the phase loop.

11. The semiconductor integrated circuit device for communication according to claim 1, further comprising transmitting mixers which form RF transmit signals from transmit baseband signals in response to the RF oscillation output signal having the oscillation frequency generated from the RF voltage-controlled oscillator, and a transmission system PLL circuit, wherein the transmission system PLL circuit includes a phase comparator having one input terminal supplied with the RF transmit signals generated from the transmitting mixers, and the RF transmission voltage-controlled oscillator which responds to an output of the phase comparator, wherein the RF oscillation output signal generated from the RF transmission voltage-controlled oscillator is fed back to the other input terminal of the phase comparator so that the phase of the RF oscillation output signal generated from the RF transmission voltage-controlled oscillator is controlled by the phase of each of the RF transmit signals generated from the transmitting mixers, whereby the RF oscillation output signal is formed from the transmit baseband signals by the transmitting mixers and the transmission system offset PLL circuit in accordance with a frequency direct up-conversion system, and wherein in such a manner that the levels of leakage spurious signals caused by mixing at the level converter, of harmonic signal components of the reference frequency signal generated upon level conversion of the level converter and high frequency signal components having leaked into the level converter in connection with the RF transmit frequency signal having the RF transmit frequency satisfy a GMSK standard at a frequency adjacent to the RF transmit frequency, the levels of the harmonic signal components generated upon the level conversion of the level converter are suppressed by the self-bias type voltage amplifier of the level converter.

12. The semiconductor integrated circuit device for communication according to claim 11, which is configured in a polar loop system for adapting to an EDGE system, and wherein the transmission system offset PLL circuit includes a phase loop for phase modulation of the polar loop system and an amplitude loop of the polar loop system, and the phase comparator and the RF transmission voltage-controlled oscillator in the transmission system offset PLL circuit constitute the phase loop.

13. The semiconductor integrated circuit device for communication according to claim 1, further comprising a voltage regulator which generates an internal power supply voltage by being supplied with an external power supply voltage, wherein the phase comparator and the RF voltage-controlled oscillator in the PLL circuit constituting the frequency synthesizer are operated by the external power supply voltage, whereas the reference frequency oscillator of the PLL circuit constituting the frequency synthesizer is operated by the internal power supply voltage, and wherein the level converter converts the amplitude level of the oscillation output signal of the reference frequency signal of the reference frequency oscillator operated by the internal power supply voltage to the input amplitude level of the phase comparator operated by the external power supply voltage.

14. The semiconductor integrated circuit device for communication according to claim 1, wherein the level converter further includes a double/single signal converter which outputs a single end output signal by being supplied with double end signals antiphase to each other, of the reference frequency signal of the reference frequency oscillator, and the single end output signal outputted from the double/single signal converter is supplied to the one end of the coupling capacitor of the self-bias type voltage amplifier.

* * * * *